(12) United States Patent
Narayanan et al.

(10) Patent No.: US 9,823,282 B2
(45) Date of Patent: Nov. 21, 2017

(54) ON-CHIP IR DROP DETECTORS FOR FUNCTIONAL AND TEST MODE SCENARIOS, CIRCUITS, PROCESSES AND SYSTEMS

(71) Applicant: Texas Instruments Incorporated, Dallas, TX (US)

(72) Inventors: Prakash Narayanan, Karnataka (IN); Sudhir Polarouthu, Karnataka (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 142 days.

(21) Appl. No.: 14/735,223

(22) Filed: Jun. 10, 2015

(65) Prior Publication Data

US 2015/0276824 A1 Oct. 1, 2015

Related U.S. Application Data

(62) Division of application No. 13/074,735, filed on Mar. 29, 2011, now Pat. No. 9,081,063.

(30) Foreign Application Priority Data

Nov. 22, 2010 (IN) .......................... 3494/CHE/2010

(51) Int. Cl.
*G01R 19/25* (2006.01)
*G01R 31/30* (2006.01)
*G01R 19/257* (2006.01)
*G01R 31/3185* (2006.01)
*G01R 31/3181* (2006.01)

(52) U.S. Cl.
CPC ....... *G01R 19/257* (2013.01); *G01R 31/3004* (2013.01); *G01R 31/3181* (2013.01); *G01R 31/318516* (2013.01)

(58) Field of Classification Search
USPC ............................................. 324/76.11, 73.1
See application file for complete search history.

(56) References Cited

U.S. PATENT DOCUMENTS

| 5,757,203 A | 5/1998 | Brown |
| 5,877,715 A * | 3/1999 | Gowda ............... H03M 1/1023 341/118 |
| 7,543,163 B2 | 6/2009 | Kernahan et al. |
| 7,555,687 B2 | 6/2009 | Varadarajan et al. |
| 7,603,578 B2 | 10/2009 | Balasubramanian et al. |
| 7,711,971 B1 | 5/2010 | Jurgilewicz |
| 2002/0153917 A1 | 10/2002 | Tanaka et al. |

(Continued)

*Primary Examiner* — Vincent Q Nguyen
(74) *Attorney, Agent, or Firm* — John R. Pessetto; Charles A. Brill; Frank D. Cimino

(57) ABSTRACT

An integrated circuit includes a functional circuit (10) having a power grid (20) with a set of power grid points (30.i) for monitoring; and an electronic monitoring circuit (100) that has a variably operable reference circuit (150) responsive to an input register (155) and having an output, comparison circuitry (110) having plural outputs and having a first input coupled to the output of said variably operable reference circuit (150) and a set of second inputs each second input coupled to a respective one of said power grid points (30.i); and an output register (120) having at least two register bit cells (120.i) respectively fed by the plural outputs of said comparison circuitry (110.i). Other integrated circuits, and processes of testing and of manufacturing are also disclosed.

17 Claims, 14 Drawing Sheets

(56) References Cited

U.S. PATENT DOCUMENTS

| | | | |
|---|---|---|---|
| 2006/0025096 A1* | 2/2006 | Jaffe | H04B 1/0014 |
| | | | 455/260 |
| 2007/0022338 A1 | 1/2007 | Varadarajan et al. | |
| 2007/0136629 A1 | 6/2007 | Nobekawa | |
| 2007/0164777 A1 | 7/2007 | Verma et al. | |
| 2008/0186044 A1 | 8/2008 | Singh | |
| 2008/0186082 A1* | 8/2008 | Singh | H03K 19/00384 |
| | | | 327/539 |
| 2008/0307240 A1 | 12/2008 | Dahan et al. | |
| 2011/0307750 A1 | 12/2011 | Narayanan et al. | |

\* cited by examiner

ON-CHIP IR DROP DETECTORS FOR FUNCTIONAL AND TEST MODE SCENARIOS, CIRCUITS, PROCESSES AND SYSTEMS

CROSS-REFERENCES TO RELATED APPLICATIONS

This application is a Divisional of prior application Ser. No. 13/074,735, filed Mar. 29, 2011, currently pending.

This application is related to India Patent Application 3494/CHE/2010 "On-Chip IR Drop Detectors for Functional and Test Mode Scenarios, Circuits, Processes and Systems" (TI-69134IndiaPS) filed Nov. 22, 2010, for which priority is claimed under the Paris Convention and 35 U.S.C. 119 and all other applicable law, and which is incorporated herein by reference in its entirety.

This application is related to U.S. patent application Ser. No. 12/904,303 "Compressed Scan Chain Diagnosis by Internal Chain Observation Processes, Circuits, Devices and Systems" (TI-68166) filed Oct. 14, 2010, and which is incorporated herein by reference in its entirety.

FIELD OF THE INVENTION

The field of the invention includes design-for-test circuits and power management circuits in integrated circuits, and processes of making and testing integrated circuits. Among other integrated circuits, various integrated circuits such as digital processors, mixed signal and logic circuits, wireless circuits, and application specific integrated circuits (ASICs) can benefit from the embodiments.

BACKGROUND

In electronics, the voltage across an electrically resistive circuit portion is equal to the product of multiplying its resistance R (ohms) times the amount of electric current I (amperes) flowing through it according to Ohm's Law. Resistance reduces voltage magnitude at points farther into a circuit from a point of application of voltage, so this voltage reduction is called IR drop.

For instance, a power supply voltage designated VDD can be applied, and a geometric structure of connected electrical conductors called the power grid of the integrated circuit provides paths for electric currents to flow to many particular locations in the integrated circuit. However, as the electric currents flow to various powered circuit portions at or on the way to the particular locations or beyond the locations, various IR drops are inherently introduced and diminish the voltage at any given particular location relative to VDD.

An integrated circuit chip device in manufacture or in the field can be operated to test it and/or operated to use the device for its intended functions. These ways of operation are called test mode and functional mode scenarios respectively.

Analog electronic circuits can have a variety of varying voltages across transistors and other components that can vary anywhere across a range of voltages. By contrast, digital electronic circuits have transistors operating as switching circuits the voltage across which approximately switches, or toggles, between just two voltage levels for instance. Electronic test equipment called a tool(s) tests an integrated circuit and dumps out values from the integrated circuit for further analysis. The information gathered by the test equipment is analyzed in the test equipment or elsewhere externally by various analysis methods.

IR drop in the chip can lead to reduction in device performance. This is true in both functional and test scenarios. Different ways of estimating IR drop in the device exist and depend on the tools and analysis methods. It is believed that many of the tools take some kind of value change dump (VCD) or the like to annotate the total activity in the nodes. But the number of VCDs, and the accuracy of the VCDs, are likely to depend on the understanding or insight of the designers with regard to the use-case.

Conventional methodology of IR drop detection has limitations. Industry standard tools are used to estimate and detect IR drop in an integrated circuit chip design. Functional/test use case scenarios are applied and taken and a value change dump file (VCD) is generated for them. This VCD is taken as an input to the tool which takes the toggle activity and provides an estimate of the IR drop in different locations in the design.

A drawback in this approach is that the data dump is only done for some scenarios that are known to the user or designer and may not cover all actual possibilities. The worst case estimate based on the VCD may not be accurate because it depends on the usage, i.e. how and which circuits in the chip are actually operated in the scenarios applied, because the amounts and distribution of electric currents around the chip, and therefore the IR drops, result from that actual operation.

In view of the above problems, it would be desirable to somehow provide solutions in this field that can address the problems and be economical in terms of chip real estate, test time and test complexity, that can offer wide applicability to various kinds of integrated circuits, and that can provide other advantages in realistic, short-cycle industrial design and productization environments.

SUMMARY OF THE INVENTION

Generally, and in one form of the invention, an integrated circuit includes a functional circuit having a power grid with a set of power grid points for monitoring; and an electronic monitoring circuit that has a variably operable reference circuit responsive to an input register and having an output, comparison circuitry having plural outputs and having a first input coupled to the output of the variably operable reference circuit and a set of second inputs each second input coupled to a respective one of the power grid points; and an output register having at least two register bit cells respectively fed by the plural outputs of the comparison circuitry.

Generally, and in another form of the invention, an integrated circuit includes a functional circuit having power grid points; and an electronic monitoring circuit that has a reference value configuration register, an analog to digital converter circuit having an input coupled to at least one of the power grid points, a digital circuit having a first input coupled to the reference value configuration register and having a second input fed by the analog to digital converter circuit, the digital circuit producing an output based on both the first and second inputs; and a multi-bit output interface fed from the digital circuit.

Generally, and in a further form of the invention, an integrated circuit includes a functional circuit having power grid points; and an electronic monitoring circuit that has an analog reference, an input circuit having a first input coupled to at least one of the power grid points and having a second input at least sometimes fed by the analog reference, an analog to digital converter circuit fed by the input circuit, the analog to digital converter producing an output, and a multi-bit output interface fed from the analog to digital converter.

Generally, an electronic test process form of the invention includes a process of testing an integrated circuit having scan chains and a power grid, the process including scanning in a scan pattern into at least one of the scan chains, comparing the voltage for different power grid points with a reference and providing the comparison results to scan registers, varying the reference and repeating the comparing, and when the comparison results satisfy a test criterion, then storing a value representing the reference thus varied as a test result.

Generally, an electronic test process form of the invention includes a process of testing an integrated circuit having scan chains and a power grid, the process including scanning in a scan pattern into at least one of the scan chains, measuring on-chip each voltage for different power grid points at least approximately and providing the measurement results in digital form to scan registers, and automatically generating on-chip statistics based on different instances of such voltage measured at the different power grid points.

Generally, a manufacturing process form of the invention includes fabricating wafers having integrated circuits with scannable power voltage monitoring circuits distributed thereon, applying test patterns to one or more of the integrated circuits and scanning out information including power voltage monitoring information and power voltage monitoring statistics derived within one or more of the integrated circuits from the scannable power voltage monitoring circuits, and passing or rejecting identified integrated circuits on the basis of the power voltage monitoring information and power voltage monitoring statistics thus obtained.

Other integrated circuits, devices and systems, and processes of testing and of manufacturing are also disclosed and claimed.

Figure 1A:
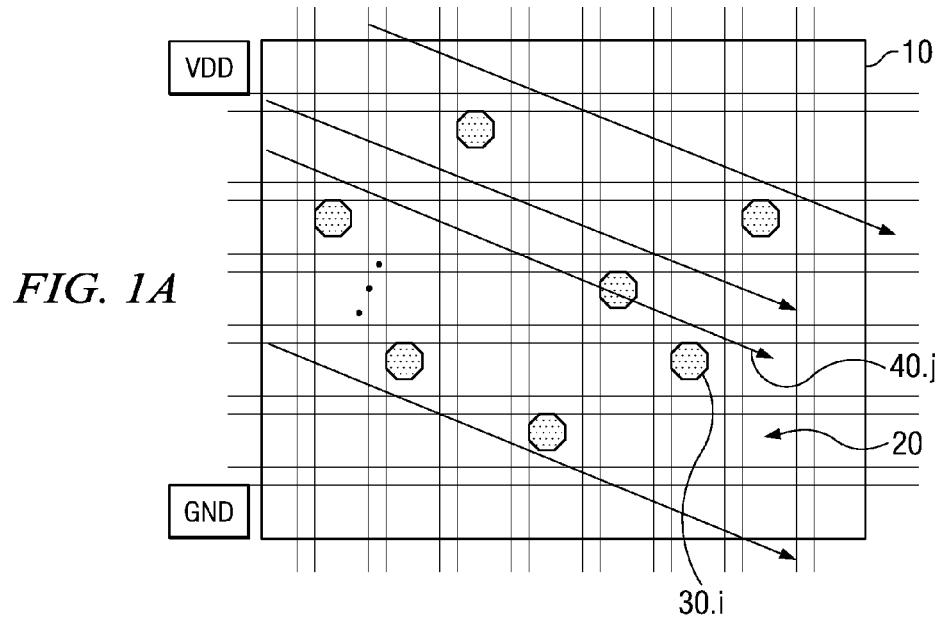
FIG. 1A is a simplified pictorial diagram of conductive lines of a power grid of an integrated circuit chip and having power grid points for electrical monitoring and testing.

Corresponding numerals in different Figures indicate corresponding parts except where the context indicates otherwise. A minor variation in capitalization or punctuation for the same thing does not necessarily indicate a different thing. A suffix .i or .j refers to any of several numerically suffixed elements having the same prefix.

DETAILED DESCRIPTION OF EMBODIMENTS

TABLE 1 provides a glossary of abbreviations and terms to facilitate the detailed description herein.

TABLE 1

GLOSSARY

ATPG: Automatic Test Pattern Generation. Using tools to generate patterns to check the quality of silicon during production. Generally refers to the stuck-at fault test pattern generation. Also can refer to $I_{DDQ}$ (static current into chip) and delay test pattern generation or transition fault test TFT.
BIST: Built-in Self Test. Internal controller logic designed to apply stimulus to test a block of logic without applying test vectors (software). May refer to Memory BIST.

TABLE 1-continued

GLOSSARY

BT: Bluetooth
Bypass Pattern: Access between tester and internal scan chains inside DUT without CoDec logic, i.e. a pattern generated when CoDec is bypassed.
CDR/PI/scan-ff: Core Data Register/Primary Input/scan-flip-flop. Some embodiments replace with programmable register for test mode control.
CoDec: Compressor (Compactor) and Decompressor (forming the scan compression logic inside the DUT).
DFT: Design for Test.
DUT: Design Under Test
FM: Frequency Modulation radio
GPS: Global Positioning System
IDDQ: Quiescent power supply current.
I/O: I = Input, O = Output.
IP core: Intellectual Property core (internal details not necessarily known to tester)
IR/DR: Instruction Register/Data Register.
JTAG: Joint Test Action Group, more commonly referring to the IEEE 1149.1 Standard, which defines the Test Access Port (TAP) and boundary scan design at the chip level.
NFC: Near field communication, a type of short distance wireless.
Scan: Structural test methodology that places the chip in a special scan state where virtually all functional flops are connected into one or more shift registers accessible to the tester, permitting test stimuli to be applied, and responses to be collected.
Setup/Header content: Control bits to configure the TAP controller (not the bits for the scan chain) or equivalent logic for test mode and ATPG setup.
SI/SO: Scan In/Scan Out
SOC: System on Chip
STUMPS: Self-Test Using MISR and PRPG Structures. Refers to internal smaller scan chains for scan-ins/scan-outs
TAP: Test Access Port. Defines I/O and state machine for test mode access.
TFT: Transition Fault Test: Generating patterns that can detect slow-to-rise and slow-to-fall faults.
WLAN: Wireless Local Area Network.
1500: IEEE1500 standard for core based testing, similar to JTAG 1149.

Various embodiments of on-chip IR drop detectors and processes for functional and test mode scenarios provide one or more mechanisms that facilitate comparison, measurement and/or other determination pertaining to one or more IR drops in an integrated circuit 10 such as in silicon or another semiconductor materials system. Such embodiments of detectors and processes are useful both in functional and test scenarios. Depending on context, the phrase IR drop may be used herein generally to refer to a voltage at some circuit point that is affected by such diminution, or may be used more specifically to refer to a voltage difference between two voltages at respective points at either end of the a mostly-resistive element.

In FIG. 1A, an integrated circuit 10 has a power grid 20, which is a layout of a material in the integrated circuit 10 that extends to a power connection for the integrated circuit of either common (ground GND), or a positive or negative voltage connection VDD. The power grid 20 may include a portion of conductor having an intersection or tap going to circuitry to be powered. Such intersection may have a via or a conductor forming a T-shape or cross-shape either broadside to the chip or in cross-section transverse to such broadside.

Figure 1B:
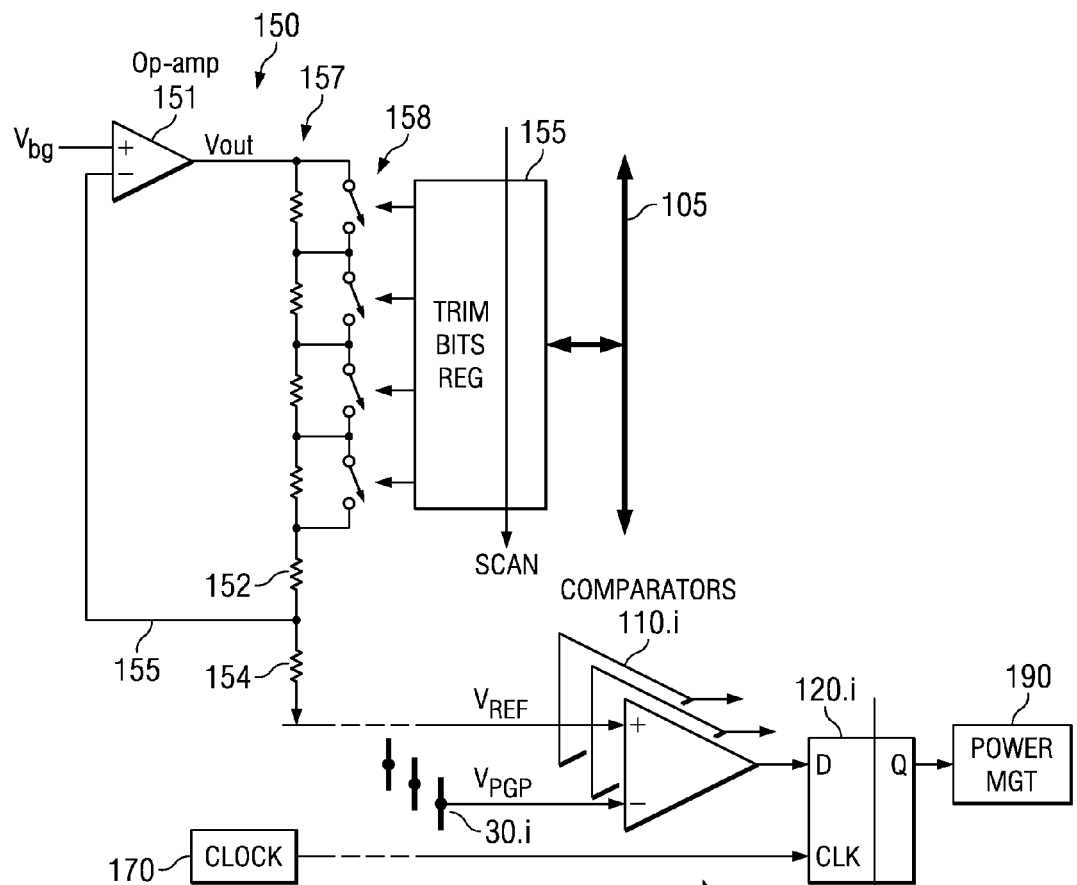
FIG. 1B is a block diagram of an inventive variable, adjustable or trimmable voltage monitoring circuit for performing various monitoring operations.

In FIG. 1A, the power grid 20 on integrated circuit 10 is tapped at various points 30.*i* as shown by enlarged dots. In cross-section (not shown) the integrated circuit 10 may have a layer of transistors and one or more elevated layers (e.g., metal or polysilicon, etc) overlying the transistor layer and coupled to the transistor layer by vias. The power grid 20 can be laid out in the one or more elevated layers. In some embodiments a respective IR drop monitoring circuit 100.*i*, such as that of FIG. 1B, is physically associated with, at, or near each of the taps (dots) 30.*i* of power grid 20 and used to detect the IR drop at its tap 30.*i*. In some other embodiments, one or more shared IR drop monitoring circuits such as any one, some or all of circuits in any of FIGS. 2-11 and 15A is electrically coupled with at least one group of the taps (dots) 30.*i* and used to detect the IR drops. Original core scan chains 40.*j* in FIG. 1A and FIG. 12 may take somewhat irregular paths through the chip 10 and deliver test bits for or from various parts of the functional integrated circuit 10, such as functional registers for operational data, and are independently indexed by index j. In general, the number of scan chains 40.*j* is different from the number of taps or power grid points 30.*i* chosen for monitoring.

At least some of the various embodiments having at least one IR drop monitoring circuit differ from each other according to the following typology: 1) each such circuit is for single tap or shared among taps, 2) comparator monitoring, 3) measurement monitoring such as with operational amplifier, 4) uses analog-to-digital converter (ADC) or not, 5) configurable by trim code bits for a trimmable voltage source or configurable by configuration bits from some other part of the IR drop monitoring circuit or not configurable, 6) one-wide scan or plural-line (n-bit) wide scan, 7) single or multiple shared circuits, 8) one-wide or n-wide digital coupling to scan chain, 9) n-wide monitoring circuit output scanned out serially or in parallel, 10) serial scan-out register or parallel register output to a data bus, 11) formation of difference value or not, as between a tap voltage and another tap or other voltage, 12) difference digitally or analog if difference value formed, 13) delivering one or more identifiers such as a count to identify a problematic power grid point, 14) combination with test port, or with functional power management, or both, 15) other types. Since most of these just-enumerated types are relatively independent of each other, numerous embodiments are providable to accommodate particular integrated circuits and test methodologies for new products and for new generations of existing products. A few of the embodiments and processes for making and/or operating them are illustrated and described herein.

In FIG. 1B, the circuit 100.*i* has a respective comparator 110.*i* that compares the voltage $V_{PGP}$ seen at a tap i, or particular location 30.*i* in the power grid 20, with an analog electrical reference $V_{REF}$ from an analog reference source circuit 150. The reference voltages for comparison with the voltage $V_{PGP}$ seen at the different points in the power grid are thus economically supplied from one same analog voltage reference circuit 150. There is a single voltage reference that is applied, no need of being unique per power grid location. The analog voltage reference can be trimmed based on a trim code from an input register 155 or by inputs from a JTAG/1500 Core Data Register (CDR) 840 or otherwise.

In FIG. 1B, circuit 150 is fed by an LDO (low drop-out voltage circuit) to provide or supply a stable voltage for ultimately deriving $V_{REF}$ as an analog reference voltage to feed to a non-inverting (+) input of a comparator 110.*i*. A given power grid voltage $V_{PGP}$ goes to an inverting (−) input of the comparator 110.*i*. In one way of its operation, comparator 110.*i* output goes high (digital one (1)) when the voltage difference between the (+) input and the (−) input is greater than zero or positive, and otherwise the output goes low. When the output goes high from comparator 110.*i* to a Data-input D of a respective D-flipflop register cell 120.*i*, then output Q of that register cell 120.*i* indicates an under-voltage condition at that power grid point upon next clock cycle of a clock input CLK. Register bit-cell 120.i is one among other such bit-cells in an overall comparator output register 120. Scan out from the comparator output register(s) 120 signals the IR-drop conditions over various parts of the functional integrated circuit to a test tool such as tester 890 of FIG. 8. The tester can be any available tester. The tester 890 provides the scan-in data beforehand to scan chains 40.j, and then scans out the scan chains 40.j, or otherwise obtains the functional-image observations of the integrated circuit chip 10. In a chip 10 different power grid point locations might have different IR drop values, but the basic circuitry of FIG. 1B is suitably used identically or uniformly in, at or near all the different points. Applications can include wireless solutions such as WLAN, Bluetooth, NFC, FM, and GPS, and any of a wide variety of other integrated circuits.

In FIG. 1B, register 120 is initialized to all zeroes, for instance. Subsequently, if the power grid voltage $V_{PGP}$ is greater than the analog voltage reference $V_{REF}$, then the comparator 110.i issues a first voltage representing one electrical state, such as '0,' at the output. If the power grid voltage $V_{PGP}$ is less than the analog voltage reference $V_{REF}$, then the comparator 110.i issues another voltage representing a second electrical state, such as '1,' at the output to indicate a possibly-problematic IR drop. The output of the comparator 110.i is stored in register cell 120.i. In FIG. 1B, one comparator 110.i is provided near each tap 30.i, and the comparators 110.i and registers 120.i are equally numerous to the taps 30.i to which they correspond. These registers 120.i are stitched into a chain, and serially scanned as a separate scan chain in FIG. 1B (or alternatively included as part of one or more of the existing scan chains 40.j). The outputs Q of these registers 120.i are strobed by a clock circuit 170 for every test pattern during debug. Scan-in data is sent to the original core scan chains 40.j, and during debug the scan chain, in which these registers 120.i are present or provided, is scanned out. A scan-out circuit can be applied to registers 120.i such as by 1) mixing Q outputs to D inputs of registers in cascade, or 2) loading a series of shadow register bit cells in parallel from the registers 120.i and scanning out the shadow registers, or otherwise.

In FIG. 1B, measurement circuit 100.i has an on-chip comparator 110.i that compares to the analog reference voltage $V_{REF}$ a dropped or diminished voltage $V_{PGP}$. Voltage $V_{PGP}$ is less than the power supply voltage VDD as IR-dropped at one or more particular locations in the power grid 20 of the integrated circuit 10. The comparator 110.i outputs a particular voltage level (e.g., representing digital one '1') if the compared power-grid-point voltage $V_{PGP}$ at a given location in the power grid is lower than the analog reference voltage $V_{REF}$. The comparator 110.i outputs a complementary voltage level (e.g., representing digital zero '0') instead if the compared power-grid-point voltage $V_{PGP}$ at that location in the power grid is greater than the analog reference voltage $V_{REF}$. The output of the comparator 110.i is fed to register 120.i.

Further in FIG. 1B, reference voltage generator 150 for each Comparator 110.i has an operational amplifier (op-amp) 151 that feeds output $V_{out}$ to a resistive divider circuit 157, 152, 154 as shown. Trim bits in register 155 control switches 158 that determine the resistance 157 that is included in the path with resistance 152, thereby altering the ratio of the resistances expressed by ((R157+R152)/R154) and hence the analog reference voltage $V_{REF}$. Analog Bandgap ref voltage $V_{bg}$ is coupled to a non-inverting (+) input to operational amplifier 151. The op amp 151 output voltage $V_{out}$ is given by $$V_{out}=K_1*V_{bg} \qquad (1)$$

$$V_{REF}=K_2*V_{bg} \qquad (2)$$

The trim bits register 155 controls trim switches 158 across trim resistances 157, thereby to control the ratio K between the analog Reference $V_{REF}$ and Vout. In FIG. 1B, the analog trim circuit 150 has such trim bits to control the output stage such as the illustrated resistor divider or network 157, 152, 154; and these trim bits can be controlled, configured or programmed using JTAG or 1500 controller of FIG. 8. This ratio is designated K (which is the ratio of the comparator output Vout to the Reference voltage $V_{REF}$ fed to the Comparator 110.i). The configuration of closed and open trim switches 158 (e.g., conducting and non-conducting transistors) is adjusted by trim bits of a trim code in register 155, thereby changing the value of ratio K. The op-amp 151 maintains the voltage at a lower point 155 on the voltage divider connected to its inverting input (−) to be same as the analog Reference $V_{REF}$.

Trimming can be defined as a change in the resistor divider at the output; it is done by varying the trim bits in register 155. The trim bits are variably controlled in some embodiments by a JTAG register or a 1500 CDR (Core Data Register 840 of FIG. 8) acting as an input register or reference value configuration register 155. These trim bits are varied by the user by writing a JTAG or 1500 register write sequence. The analog voltage reference $V_{REF}$ output is set first, then it is compared with each voltage $V_{PGP}$ at the different power grid points 30.i. The output of each IR drop comparator 110.i is registered in the comparator register 120, and register 120 is read out. The trimming is controlled by an outer loop such in any of FIG. 13, 14 or 15 that is progressively trimming down or reducing the reference voltage $V_{REF}$ that is compared with the power grid voltages $V_{PGP}$. The output scanned from register 120 is analyzed to identify the worst case power grid location among points 30.i and the corresponding value of IR drop. Some other embodiments have a dedicated input register 155 for a variably operable reference circuit of digital or mixed analog/digital type. The input register 155 may have its value varied automatically by an on-chip control circuit so as to trim or otherwise adjust it as or for the reference circuit of which circuit 150 is one example.

Thus in FIG. 1B, the analog reference voltage $V_{REF}$ is generated by a trimmable voltage reference circuit 150 as one type of a variably operable reference circuit. Circuit 150 has an operational amplifier 151 fed at a first input with a constant voltage $V_{bg}$, such as based on the bandgap of a semiconductor substance or other substantially constant source. Op-amp 151 provides a voltage Vout to a network of resistances 152, 154. Trim Bits Register 155 is configured either by Scan-in or through a bus 105. Trim Bits Register 155 is coupled to trim the resistance 152, which includes a series of smaller-ohmic-value trim resistances 157. These trim resistances 157 can be selectively bypassed by respective lower-resistance switching elements 158, such as transistors controlled by respective trim bits in the Trim Bits Register 155. Resistances 152 and 154 are connected to a line 155 that feeds negative feedback to an inverting second input of the operational amplifier 151. In this way, a trimmably-adjustable, constant analog reference voltage $V_{REF}$ is stabilized and provided at an opposite end of resistance 154 to one or more comparators 110.i.

It should be understood that various trimmable circuits can be provided or modified from circuit 150 as shown. For instance, operational amplifier or other circuits accompanied by any of a variety of networks and with various couplings between them can be provided to obtain the desired operation for the purposes at hand, based on the teachings herein, and using ordinary skill and available circuit technology.

Notice in the embodiment of FIG. 1B that the analog reference voltage $V_{REF}$ is suitably coupled to a high impedance input of the on-chip comparator 110.$i$ or otherwise suitably arranged to draw very little current so that the analog reference voltage $V_{REF}$ can be distributed around the chip 10 to many measurement circuits 100.$i$ with negligible IR drop of its own. That way, the circuitry reliably distributes and provides reference voltage $V_{REF}$ to all the comparators 110.$i$ wherever they might be located. The comparators 110.$i$ provide one example of comparison circuitry having plural outputs, and having a first input coupled to the output of the variably operable reference circuit and a set of second inputs with each second input coupled to a respective one of the power grid points for monitoring. Other examples of such circuitry are described in connection with other Figures herein.

Alternatively, some embodiments provide a reference that is current based and has an analog reference source circuit 150 that applies a modest reference current $I_{REF}$ to an established, controlled input impedance of the comparator 110.$i$.

In FIG. 1B, note also that some embodiments couple one or more of the IR drop monitoring scan registers 120.$i$ to a power management circuit 190. In this way, instances of excessive IR drop can not only be detected during scan test, but also the power management circuit 190 can respond to such instances of excessive drop during regular functional operation of the integrated circuit 10. Such power management response may reduce functional operating frequency or increase supply voltage, or both, such as by transitioning to a different voltage/clock frequency DVFS Operating Performance Point (OPP) or doing automatic voltage scaling AVS. For some background on DVFS, OPPs, AVS and power management, see U.S. Patent Application Publication 20080307240 (TI-60478) "Power Management Electronic Circuits, Systems, and Methods and Processes of Manufacture," which is incorporated herein by reference in its entirety.

In some sense, connecting the comparator registers 120.$i$ as part of a scan chain that is read by JTAG or 1500 or as part of a data output register means they are connected as a group. The output of the comparator(s) 110.$i$ can be counted to identify the number of times it goes low indicating a high IR drop. See, e.g., counter(s) 280, which can be used to accumulate counts over time at a power grid point, or accumulate counts over power grid points. And a count value can be taken as an input from a 1500 CDR against which this or another type of count is compared. If it meets or departs from the user provided count, whichever the test scenario is intended to detect, then the clock of a register that captures the comparator output can be gated, and the statistics counter can be gated in various ones of the embodiments.

The comparator register 120.$i$ and comparator registers and any other output registers of other Figures are coupled to a scan I/O interface on-chip to communicate with the tester 890 off-chip. The comparator registers 120.$i$ in some embodiments have a scan shift circuit coupling them, or also have a scan shift register associated with and shadowing them for shifting. This facilitates some embodiments like that of FIG. 9 or those of other Figures. A digital comparator register or a digital subtracter register can constitute the cells of the scan shift register for the IR drop scan chain. The comparator register itself forms a scan flip-flop. The "D" input of the flip-flop captures the output from the comparator. The "Q" output of one of these comparator registers drives an "SD" input of the next comparator register, thereby forming a scan chain. This scan chain can be connected to the top-level scan channel during debug scenario.

The clock circuit 170 provides the clock inputs to the comparator registers 120.$i$. Suitable control circuitry as in FIG. 8 controls and coordinates the clock input to scan-in a trim code to trim bits register 155 (or 255) or scan-out IR drop information. The shift clock 170 or x70 that is used for shifting in the patterns is suitably re-used for the comparator registers 120.$i$ for scan-out as well. The clock 170 to the comparator(s) 110.$i$, or shared comparator 210, is suitably gated after a few cycles so that it does not register new data. Also, the comparator register 120.$i$ is data gated so that once a '1' is registered to indicate that the power grid voltage is lower than the analog reference voltage it is not altered. During the scan-in operation, the comparator registers 120.$i$ capture initialization or other data through their D inputs, and during the scan-out operation, the data bits are shifted out to the top-level scan outs.

Figure 1C:
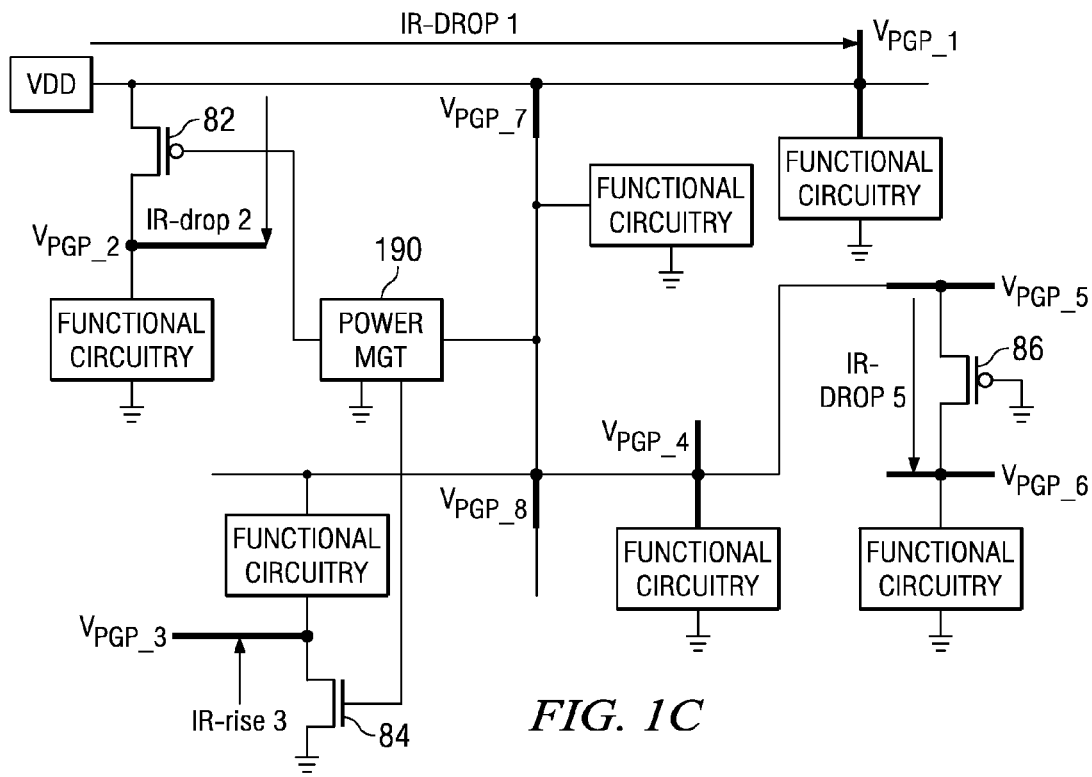
FIG. 1C is a detail of part of FIG. 1A showing functional circuit blocks coupled with the power grid and having power grid points for monitoring.
Figure 2:
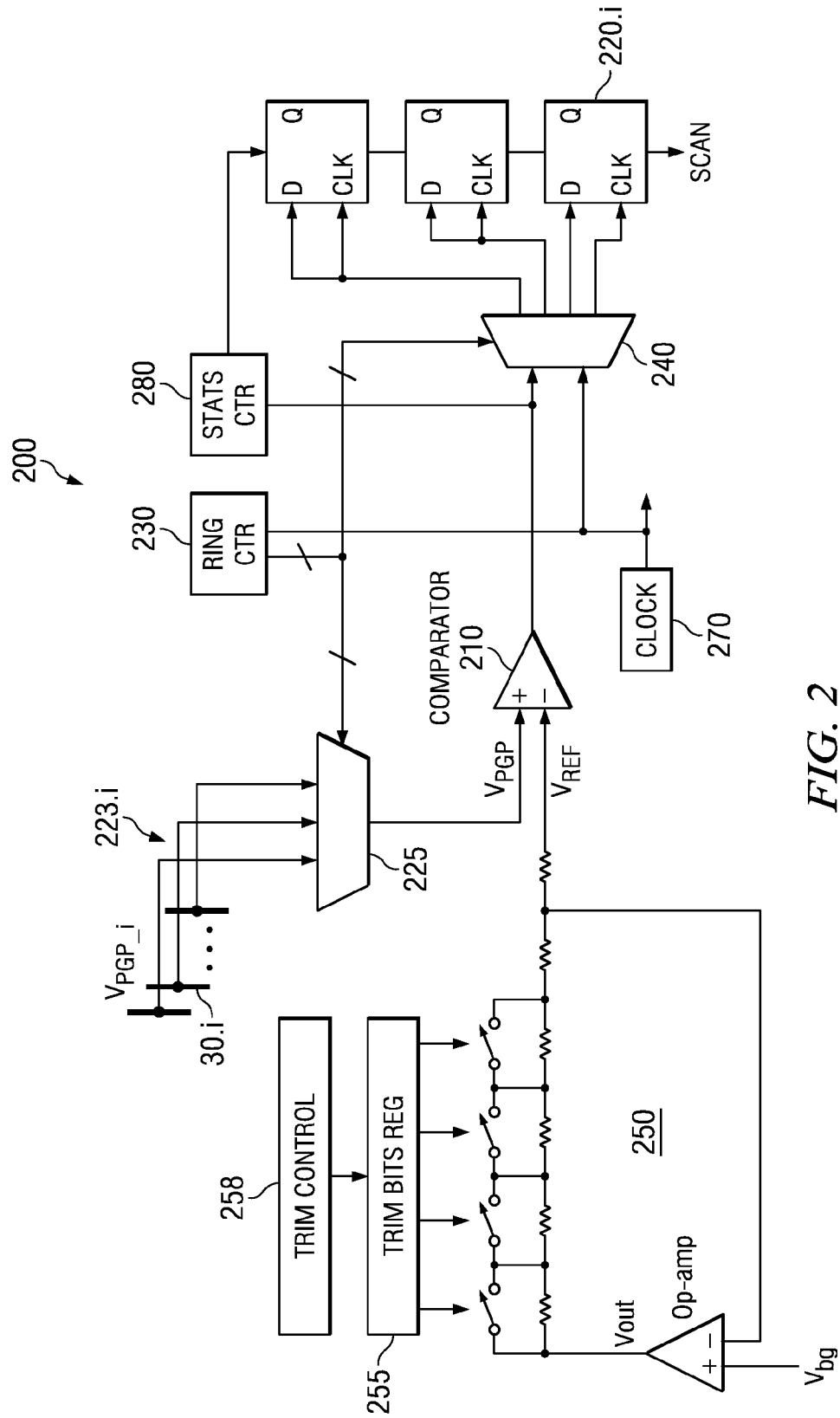
FIG. 2 is a block diagram of an inventive electronic monitoring circuit with multiplexing for a comparator feeding a statistics circuit.

In FIG. 1C, two forms of IR drop are shown for use in FIG. 1B and FIG. 2 and other Figures herein. IR-drop 1 represents a voltage drop to $V_{PGP\_1}$ due to current flow along a length of conductor. Voltages $V_{PGP\_2}$ and $V_{PGP\_3}$ respectively occur due to IR-drop 2 and IR-rise 3, which are each a voltage difference resulting from current flow through a full-on gate-to-ground p-FET transistor 82 or a full-on, gate-high n-FET transistor 84. Such transistors can be hard-wired-on in-circuit as shown for transistor 86 or have the gate instead controlled on or off as shown for transistors 82 and 84 by connection to power management controller circuit 190. $V_{PGP\_4}$ is a voltage less than $V_{DD}$ resulting from a combination of voltage drops due to various combinations of different supply currents flowing over multiple portions of conductor, wherein the currents flow between $V_{DD}$ pin and any of the unnumbered blocks of functional circuitry as well as the particular block nearest the point of measurement of $V_{PGP\_4}$. The blocks of functional circuitry are implicitly returned to circuit common (ground GND) directly unless a transistor like 84 is shown. Voltage differences can be measured where one level of supply current exists, such as between conductor points having voltages $V_{PGP\_4}$ and $V_{PGP\_5}$ or across ends of transistor 86 having voltages $V_{PGP\_4}$ and $V_{PGP\_5}$. Such voltages can be measured or compared individually relative to ground or VDD or some other reference, or can be measured or compared differentially as in FIG. 7A. Thus any voltage $V_{PGP}$, as obtained by these different methods or others, may be measured or compared herein.

The voltages or comparisons are sent back to the tester individually, differentially, or some combination thereof using any of the embodiments as taught herein. Given a tester that has the netlist and place-and-route information, the information returned from the DUT can be sorted out in any manner desired. For example, suppose voltages $V_{PGP\_1}$ through $V_{PGP\_6}$ are returned individually as measured voltages. Also suppose the intended test is set up to find excessive voltage drops. Then from the netlist for FIG. 1C the tester can deduce that portions having a current pertaining to one block are, e.g., ($V_{DD}-V_{PGP\_2}$), ($V_{PGP\_7}-V_{PGP\_1}$), $V_{PGP\_3}$, ($V_{PGP\_5}-V_{PGP\_6}$). If the block fed through transistor 86 is on while its neighbor block is off, then the ratio ($V_{PGP\_5}-V_{PGP\_6}$)/($V_{PGP\_8}-V_{PGP\_4}$) represents the ratio of the on-resistance of transistor 86 to the resistance of the section of conductor linking $V_{PGP\_8}$ and $V_{PGP\_4}$. Then when the neighbor block is activated as well, as indicated by primed voltages ('), the current into the neighbor block on a per-unit basis (unit based on current through transistor 86) is:

$$(V'_{PGP\_8}-V'_{PGP\_4})/(V_{PGP\_8}-V_{PGP\_4})-1 \qquad (4)$$

If the block associated with $V_{PGP\_3}$ is activated instead, as indicated by double-primed voltages ("), the current into that $V_{PGP\_3}$ block on a per-unit basis (unit based on-resistance of transistor 86) is found by leaving the blocks between $V_{PGP\_8}$ and $V_{PGP\_7}$ powered off through the various activations and yields:

$$[(V''_{PGP\_8}-V''_{PGP\_7})/(V_{PGP\_8}-V_{PGP\_7})-1] \qquad (5)$$

Thus, voltages at different points in the circuit of FIG. 1C can be obtained in one or more scan passes and employed in a variety of electronic computations in the tester to flexibly obtain test information about the circuit of FIG. 1C.

In FIG. 2, several power grid voltages $V_{PGP\_i}$ are muxed by an N:1 multiplexer circuit 225 to a non-inverting (+) input of a shared on-chip comparator 210 in an IR drop monitoring circuit 200. Multiplexer circuit 225 suitably has a set of FETs (field effect transistors) with drains respectively connected to the taps 30.*i* with power grid voltages $V_{PGP\_i}$, and with sources all connected to (+) input of comparator 210, and with FET-gates coupled to respective outputs of a ring counter 230 that turns the transistors on and off one by one consecutively, or round-robin. Comparator 210 compares each dropped voltage $V_{PGP}$ with an analog reference voltage $V_{REF}$ from a circuit 250 trimmed by a trim register 255 responsive to a trim control circuit 258. Trim control circuit 258 and its operations are described later hereinbelow with FIG. 13. Scan-in data is sent beforehand to trim register 255 and to the original core scan chains 40.*j*. Comparator 210 outputs a particular voltage level (e.g., representing digital one '1') if the compared power-grid-point voltage $V_{PGP}$ at a given location 30.*i* in the power grid is higher than the analog reference voltage $V_{REF}$, and otherwise comparator 210 outputs complementary digital output, e.g. zero '0' instead. The output of the comparator 210 is demuxed along with a strobe clock 270 to load scannable registers 220.*i* one-by-one via a 2×(1:N) demultiplexer 240 coordinated with N:1 mux 225 and with selector control correspondingly responsive to ring counter 230. Scannable registers 220.*i* are strobed one-by-one by clock circuit 270 for every test pattern during debug. (Alternatively, mux 240 is omitted, and comparator 210 is fed to one of the registers 220.*i* which is shifted along using clock 270 as a shift clock prior to scan-out to load all the registers 220.*i*.) During debug, the scan chain having registers 220.*i* is scanned out to deliver information to the tester 890, wherein the zero '0' outputs in this example identify which taps 30.*i* are experiencing excessively IR-dropped voltage $V_{PGP\_i}$. In this way, the comparator 210 circuitry is not replicated for each tap but shared instead. This FIG. 2 embodiment is appealing when the number of taps 30.*i* is large enough so that the single comparator circuit 210 makes circuit-sharing real-estate-economical. Also, for the integrated circuit 10, the tap lines 223.*i* have routing lengths to mux 225 which are likely quite acceptable.

Figure 3:
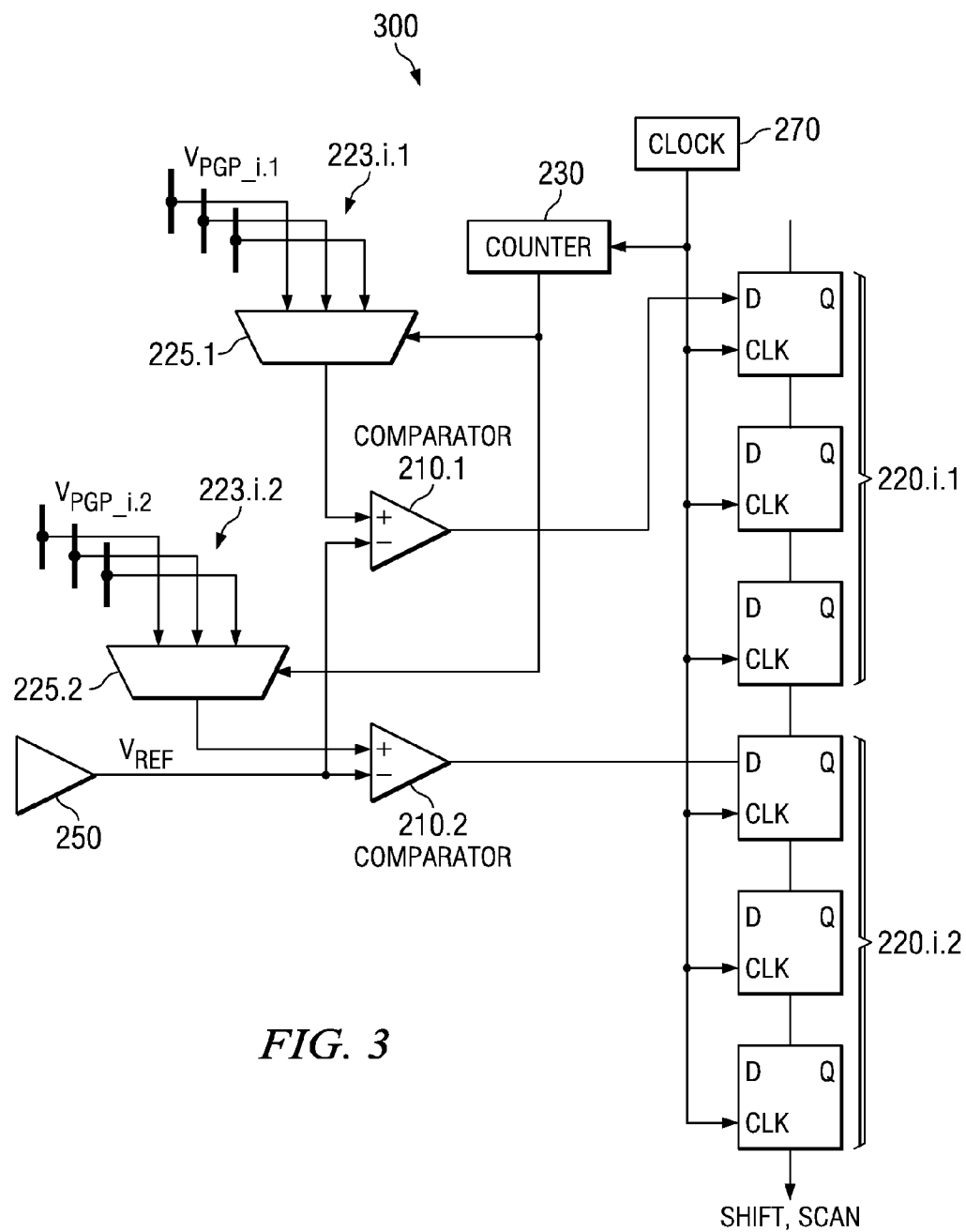
FIG. 3 is a block diagram of an inventive electronic monitoring circuit with input multiplexing for plural comparators and shifting of their outputs into an output register for scan out.

In FIG. 3, replicating the shared circuitry of FIG. 2 once or just a few times reduces line lengths for routing tap lines 223.*i*.1 and 223.*i*.2 even further in some integrated circuits. Each mux 225.1, 225.2 serves a separate set of the taps 30.*i* so that a set of power grid point voltages VPGP_i.1 and another set of power grid point voltages VPGP_i.2 are fed to respective shared comparators 210.*i*.1 and 210.*i*.2. Ring counter 230 has a round-robin cycle length adapted to handle muxes 225.1 and 225.2 in tandem, which can further economize counter 230 circuitry. Demuxes like 240 of FIG. 2 may be included, but are instead omitted from FIG. 3. In FIG. 3, each comparator 210.1 or 210.2 is fed to a set of the registers 220.*i*.1 or 220.*i*.2, which are concurrently shifted in their own set .1 or .2 along using clock 270 as a shift clock to load each set of registers 220.*i*.1 and 220.*i*.2 prior to scan-out. Subsequently, scan out serially delivers the IR-drop comparison bits from all the registers 220.*i*.1 and 220.*i*.2 to the tester 890.

Figure 4:
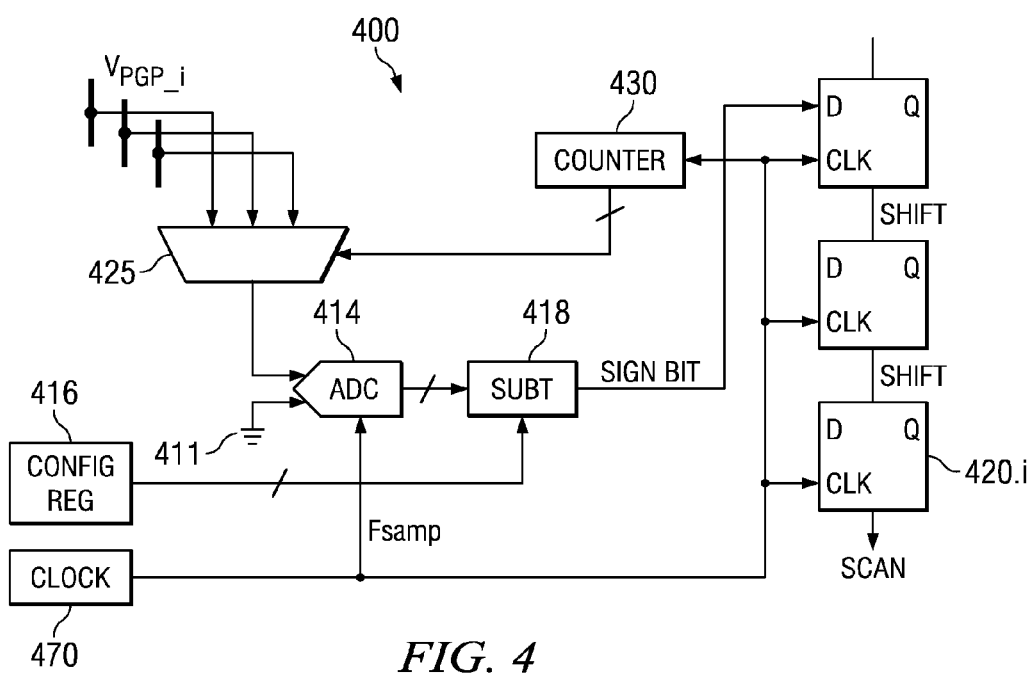
FIG. 4 is a block diagram of an inventive electronic monitoring circuit with input multiplexing and analog-to-digital conversion for digital monitoring relative to a reference from an input register.

In FIG. 4, an alternative embodiment can be done as well that sends the power grid location voltages along lines sequentially muxed by mux 425 under control of a counter 430. The output voltage of mux 425, relative to circuit common or ground 411, is fed as input to an analog-to-digital converter ADC 414. A clock circuit 470 clocks counter 430 and provides sampling clock to a sampling control input of ADC 414. A digital comparison value is loaded beforehand into a Configuration Register 416 that is provided as an alternative to the trimmable analog circuit 250 of FIG. 2. The digital output of ADC 414 and the digital comparison value from Configuration Register 416 are fed to respective inputs of a digital subtracter 418. Digital subtracter 418 is optimized to act as a digital comparator with one output line for the sign bit (greater than, less than) line. Subtracter 418 output is fed to one of the registers 420.*i* which is shifted along using clock 470 as a shift clock prior to scan-out to load all the registers 420.*i*. Subsequently, scan out serially delivers the IR-drop comparison bits from all the registers 420.*i*. to the tester 890. The digital comparison value in Configuration Register 416 is another example of a value of a reference, and the digital comparison value can be varied according to process embodiments as taught in connection with various Figures herein. Circuit 258 of FIG. 2 with a stop-counter circuitry and output circuit as described later hereinbelow (FIG. 15A) can also be applied in FIG. 4.

Figure 5:
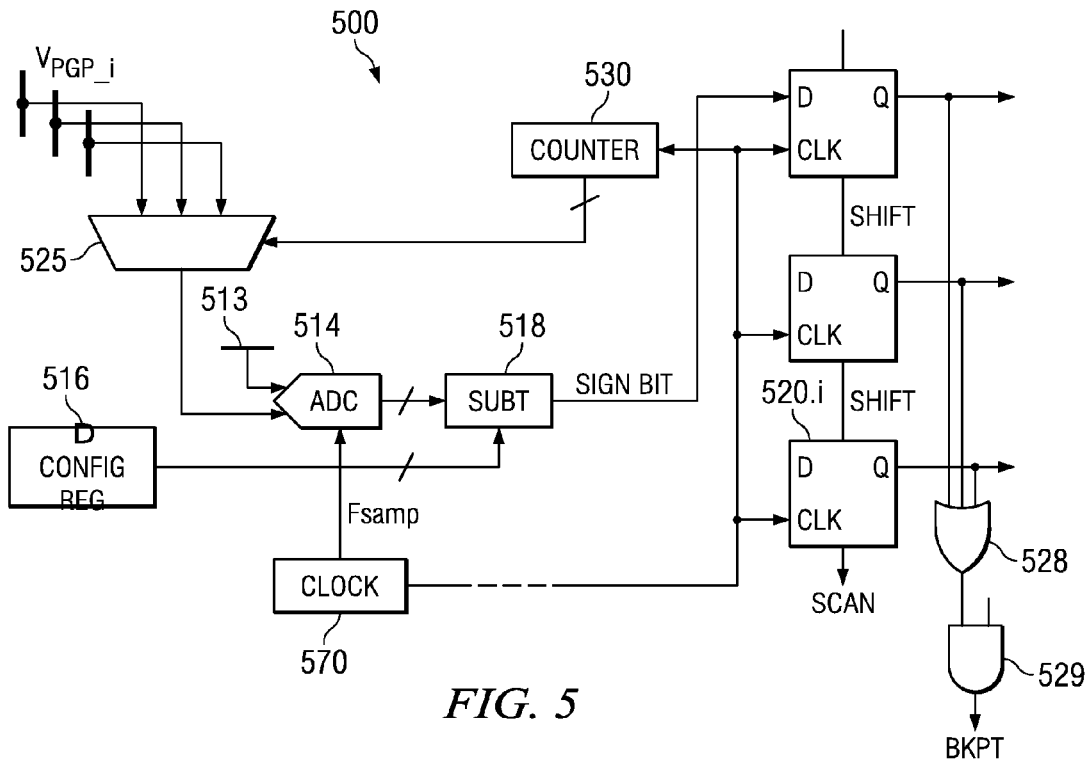
FIG. 5 is a block diagram of an inventive electronic monitoring circuit with conversion input referenced to supply voltage and delta-configuration for digital monitoring.

In FIG. 5, an IR drop monitoring circuit 500 has 5xx numerals, and the description of the 5xx numerals mostly parallels the 5xx numerals for FIG. 5. However, in FIG. 5, the IR-dropped selected $V_{PGP\_i}$ from mux 525 is fed relative to VDD 513 (meaning VDD provided with negligible IR drop) as input to an ADC 514, and not input relative to ground. The digital output of ADC 514 digitally represents the voltage difference between ADC input and VDD 513. A delta-digital comparison value Δ is loaded beforehand into a Configuration Register 516 and represents a programmed IR drop potential difference value for comparison. The digital output of ADC 514 and the delta-digital comparison value Δ from Configuration Register 516 are fed to respective inputs of digital subtracter 518. Digital subtracter 518 provides a sign bit output round-robin to registers 520.*i* due to clock 570 operating as a shift clock for registers 520.*i*. Clock 570 also clocks ring counter 530 and provides ADC 514 sampling clock Fsamp. Varying the value in register 516 and using a circuit 258 (FIG. 2, see also FIG. 15A) are also applicable to FIG. 5.

In FIG. 5, some embodiments provide a break point BKPT from the IR drop monitoring circuitry to stop a functional circuit clock within a few cycles of some problematic scenario that caused an excessive IR drop in one or more of the functional circuits. Breakpoint hardware 528 is provided on-chip and connected to or fed by the IR drop monitoring circuitry 500 configured for intended operation. The outputs of output register cells 520.*i* are coupled to an OR-gate 528 that provides the output BKPT if any of the IR drops is excessive. Output BKPT active disables clock to the functional circuitry to stop the functional circuitry and enable a breakpoint-initiated scan-out. The output BKPT is disabled by an AND-gate 529 when the breakpoint mode is off. For breakpoint detection, some embodiments derive clock 570 directly from the functional clock F (or from divided functional clock like F/2 or other small divisor). Monitoring circuitry 500 thus runs based on functional clock starting from instant of scanned-in valid functional image ready. In this type of operation, shift clock for registers 520.$i$, clock for ring counter 530, and sampling clock Fsamp are all based on functional clock when the test run commences. When the test is either run to completion or the breakpoint BKPT has been activated, whichever comes first, functional-based clock stops and output operations take over. The output scan registers 520.$i$ are scanned out in due course at a scan clock rate.

Figure 6:
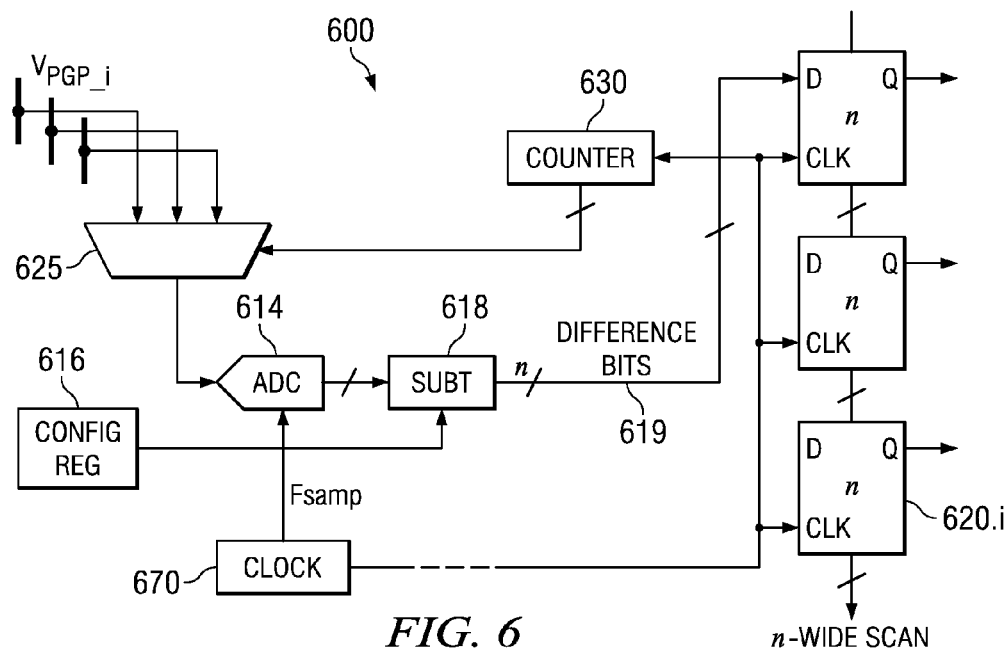
FIG. 6 is a block diagram of an inventive electronic monitoring circuit with multi-bit measurements of multiplexed power grid points.

In FIG. 6, an IR drop monitoring circuit 600 is analogous to that of FIG. 4 and is enhanced further with n-bit wide output from subtracter 618 and n-wide output registers 620.$i$. The input to ADC 614 is either relative to ground or to VDD whichever is chosen based on the description of FIG. 4 or FIG. 5. In FIG. 6, subtracter 618 is operated as an n-bit wide digital subtracter instead of a single-line output digital comparator. This embodiment is useful especially in circuits having numerous scan chains 40.$j$ operated in subsets that are compacted to multiple scan lines as in FIG. 12. Since the multiple scan lines are already present, the output registers 620.$i$. of the FIG. 6 IR drop monitoring circuit 600 are conveniently muxed with them and rapidly deliver fine-grained IR drop information to the tester 890. Note that the circuit of FIG. 6 expends some circuitry for output registers 620.$i$ while saving some looping time searching for worst case IR drop. Other embodiments expend some acceptable looping time and involve less output register circuitry. Thus, various embodiments can satisfy various cases of particular monitoring circuit and process goals.

Figure 7:
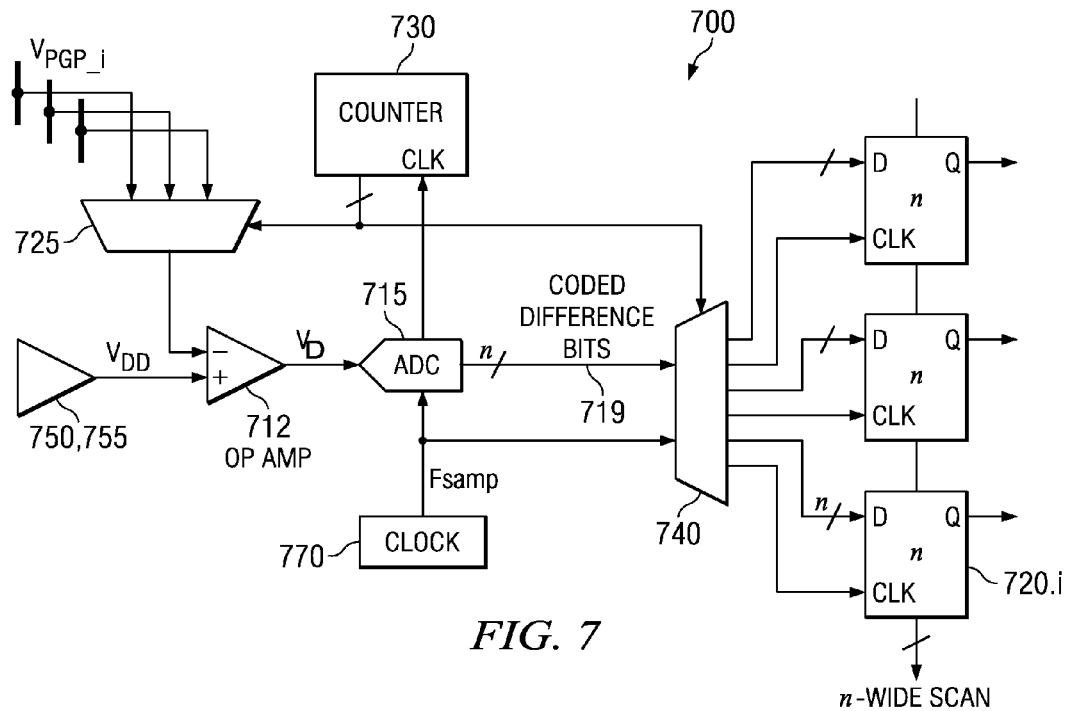
FIG. 7 is a block diagram of another inventive electronic monitoring circuit with reversal of conversion and subtraction for multi-bit measurements of multiplexed power grid points relative to FIG. 6.

In FIG. 7, an IR drop monitoring circuit 700 combines some features of FIG. 2 and FIG. 6 and is enhanced further. Circuit 700 is enhanced further by reversing the order of ADC and subtraction from that in FIG. 6 and enhanced over FIG. 2 by providing n-wide digital output, among other things. Several power grid voltages $V_{PGP.i}$ are muxed by an N:1 multiplexer circuit 725 to an inverting (−) input of a shared on-chip operational amplifier 712. Op-amp 712 has an associated resistive network or other network (not shown) with appropriate values to establish a desired gain for monitoring of voltage differences involved in IR drops. Op-amp 712 is an example of an input circuit structured to present a high input impedance that avoids undesirably affecting measurements such as by presenting negligible load to the power grid points. Op-amp 712 also is structured to produce an output as a joint function of its inputs such as a function of the difference of the input voltages. A selector circuit 730 such as a ring counter or counter-decoder operates the selection by mux 725. Op-amp 712 analog-subtracts each dropped voltage $V_{PGP.i}$ from supply voltage VDD, such as by a line connected from VDD pin without significant IR drop. No configuration register or reference voltage $V_{REF}$ circuit is involved here. Scan-in data is sent beforehand to the original core scan chains 40.$j$. Op-amp 712 outputs an analog difference voltage $V_A$ that feeds the input of an ADC 715. ADC 715 supplies an n-bit output representing difference voltage $V_A$ in digital form. Thus, the op-amp 712 and ADC 715 are not replicated for each tap 30.$i$ but shared instead. An n-wide output of the ADC 715 is demuxed along with a strobe clock 770 to load scannable registers 720.$i$ one-by-one via a 2× (1:N) demultiplexer 740 coordinated with mux 725 and with selector control of mux 740 correspondingly responsive to counter 730. Scannable registers 720.$i$ are strobed one-by-one by clock circuit 770 during a load sequence on a given test pattern, and are loaded and scanned out for every test pattern during debug. (Alternatively, mux 740 is omitted and the output circuit is patterned after FIG. 6.) During debug, the scan chain having registers 720.$i$ is scanned out n-wide to deliver information to the tester 890, and tester 890 determines what taps 30.$i$ are experiencing excessively IR-dropped voltage $V_{PGP.i}$.

Figure 7A:
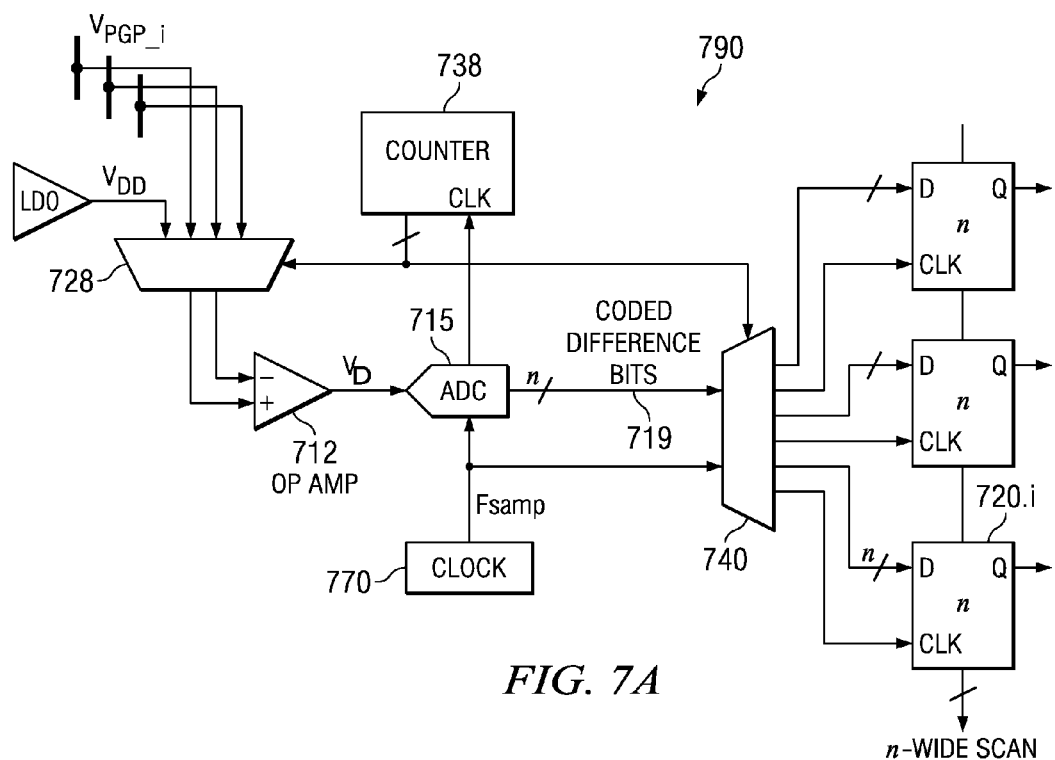
FIG. 7A is a block diagram of another inventive electronic monitoring circuit with an alternative form of input involving pairwise multiplexing for differential voltage monitoring relative to FIG. 7.

In FIG. 7A, an IR drop monitoring circuit 790 is analogous to the circuitry described in connection with FIG. 7 and is enhanced further with an IR drop-differencing embodiment. Here, mux 728 has an additional input for VDD, such as supplied from an LDO (low drop out voltage regulator circuit). Counter 738 is enhanced to activate the mux 728 transistors in pairs to couple them pairwise according to n selections in turn to an output line-pair to op-amp 712. Note that IR drop-differencing using counter 738 to activate mux 728 pairwise can be applied in substitution for counter x30 and mux x25 of other FIG.x circuits herein to form still further embodiments for differential voltage measurements as described in connection with FIG. 1C. Some embodiments further find a difference between a differential voltage and a reference voltage by combining the FIG. 7A circuit with a reference voltage circuit like 150 of FIG. 1A or using the FIG. 5 Δ-Configuration register 516 and subtracter 518 in FIG. 7A. This FIG. 7A circuit embodiment and other such embodiments can also be used to compress voltage $V_{PGP}$ information as IR drop information or other difference information to yield a reduced number n of overall monitoring bits for scan out of the same effective amount of information.

Figure 8:
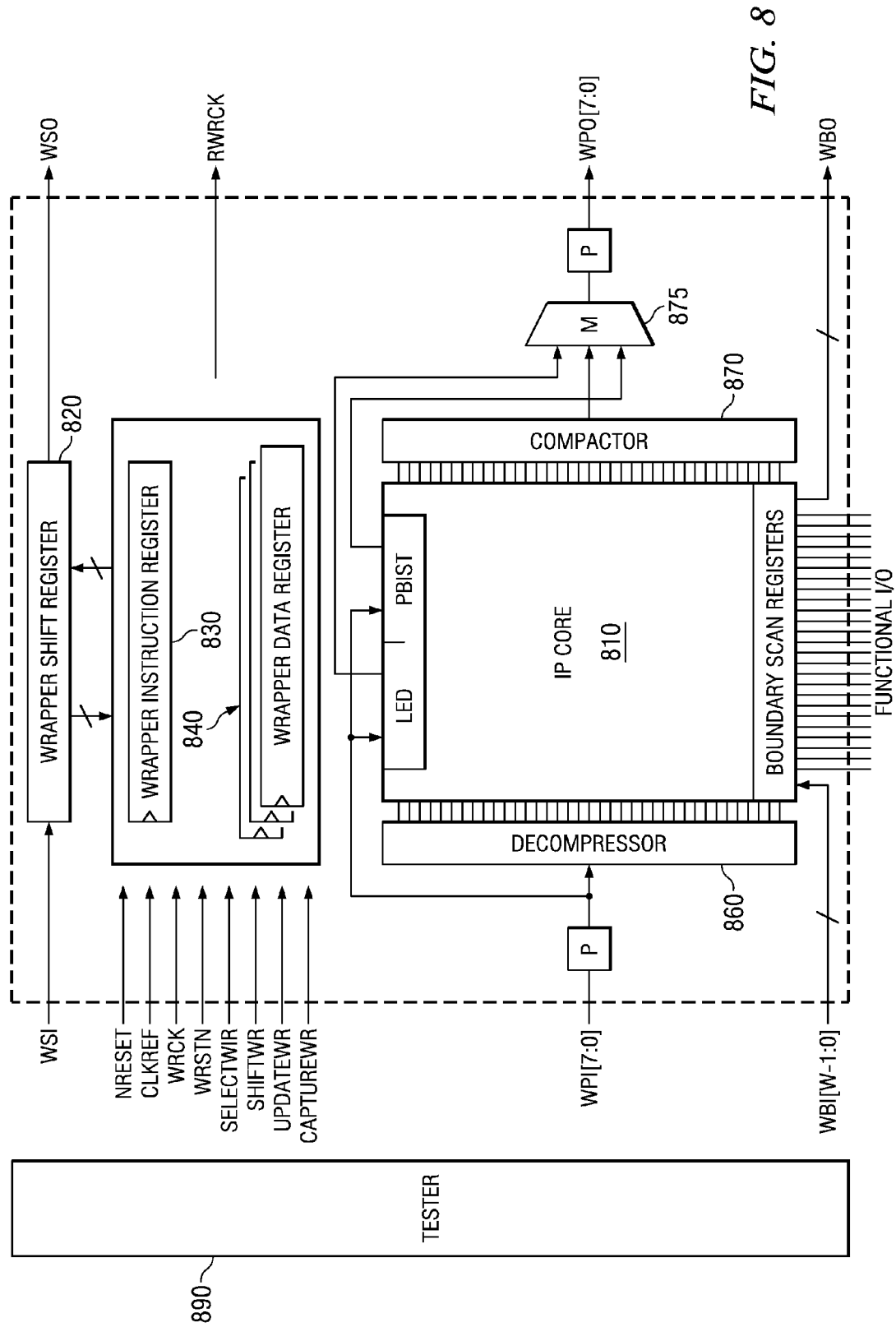
FIG. 8 is a block diagram of an inventive circuit combination having a scan interface and a tester for combined operation and coupling with any of the inventive electronic monitoring circuits of the other Figures.

In FIG. 8, IEEE 1500 is used to setup/control many of the test related features within the functional integrated circuit, or IP core, 810 according to embodiments combining FIG. 8 with circuits and processes of any of the other Figures. In this way, tester 890 communicates with an interface 820, 830, 840, 875 that couples chip-level test pins with a functional integrated circuit 810 and provides a test wrapper to allow access to the functional integrated circuit 810. The test wrapper has a Wrapper Shift Register 820 for serial entry of instructions and data via a Wrapper Shift Input WSI and can scan out resulting information at Wrapper Shift Output WSO. A Wrapper Instruction Register 830 is coupled and controlled to receive the test instructions from Wrapper Shift Register 820. A Wrapper Data Register 840 is coupled and controlled to receive the test data from Wrapper Shift Register 820 or conversely to deliver resulting data to Wrapper Shift Register 820 for serial scan out at WSO. A set of control signals NRESET, CLKREF, WRCK, WRSTN, SELECTWIR, SHIFTWR, UPDATE WR, AND CAPTUREWR control these operations.

Further in FIG. 8, an 8-wide input WPI[7:0] feeds a Decompressor 860 as well as a Load Execute Dump LED interface and a programmable BIST or PBIST, interface. Decompressor 860 provides and sets up a bit-image for functional integrated circuit 810 to operate upon, and the LED and PBIST interfaces are coupled to control what operations are to occur and be tested. See also FIG. 1A and FIG. 12 for analogous circuits to Decompressor 860 with scan chains, and to Compactor 870. IR drop monitoring circuits as shown in any of the various Figures are included in combination embodiments with the test wrapper FIG. 8. A mux 875 has three inputs respectively fed by a Compactor 870, by an output from the Load Execute Dump LED interface, and by an output from the PBIST interface. Mux 875 delivers test results to an output designated WPO[7:0].

Functional integrated circuit 810 also has boundary scan registers that provide functional I/O and also have a serial input WBI[(W−1):0] and a serial output WBO. FIG. 8 is one illustration of a particular on-chip test interface to tester 890, and various embodiments may lack any of various features such as DMLED, PBIST, etc., or use some other test interface or none at all.

Figure 9:
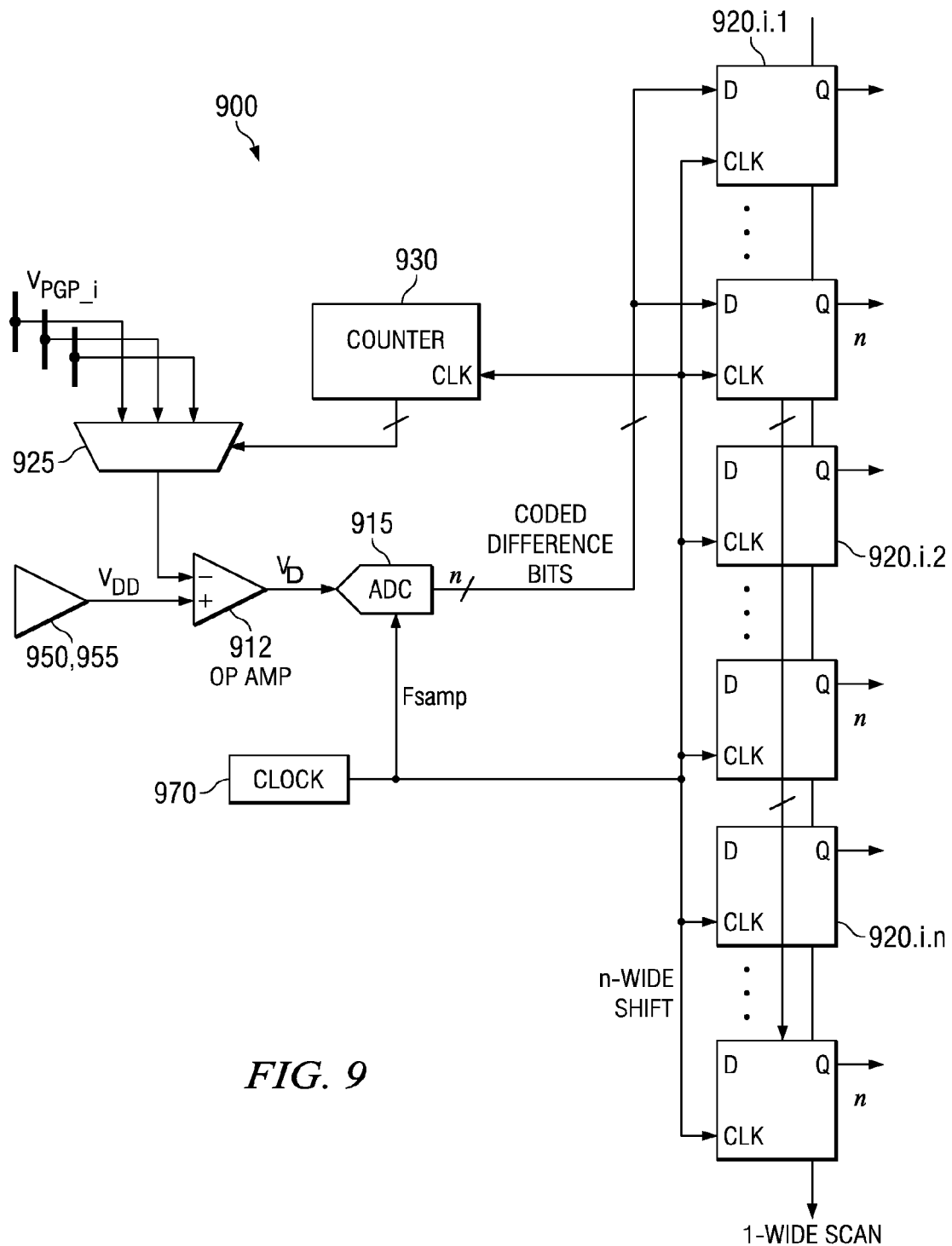
FIG. 9 is a block diagram of an inventive electronic monitoring circuit with an alternative form of shiftable and scannable output circuit relative to FIG. 7.

In FIG. 9, an IR drop monitoring circuit 900 is described analogous to mux/op-amp/ADC portion of the circuitry described in connection with FIG. 7 and is enhanced further with a 1-wide serial scan output and clock distribution thereto replacing the muxed feed to n-wide scan output of FIG. 7. ADC 915 has its n-bit wide output fanned out to a corresponding set of number n of single-input D flip flops 920.$i$.1. The sets of flip-flops in turn are connected for shift in n shift chains so the clock 970 shifts difference bits loaded in the first set of n flip-flops to the second set of n flip-flops, and then to the third set, and so on until all the IR drops (VDD−$V_{PGP,i}$) for power grid points 30.$i$ are ADC converted. Notice that the flip-flops are connected to scan out as one scan chain 1-wide (or otherwise less than n-wide). A further embodiment enhances FIG. 9 by using IR drop-differencing methodology analogous to FIG. 7A but with 1-wide serial scan output instead of the n-wide scan output of FIG. 7A. Using differencing in FIGS. 7A and 9 can effectively provide some data compression by generating fewer significant LSBs and more zeroes for MSBs that need no scan-out, and thus can economize the 1-wide serial scan chain 920.$i$.1, .2, . . . n.

Figure 10:
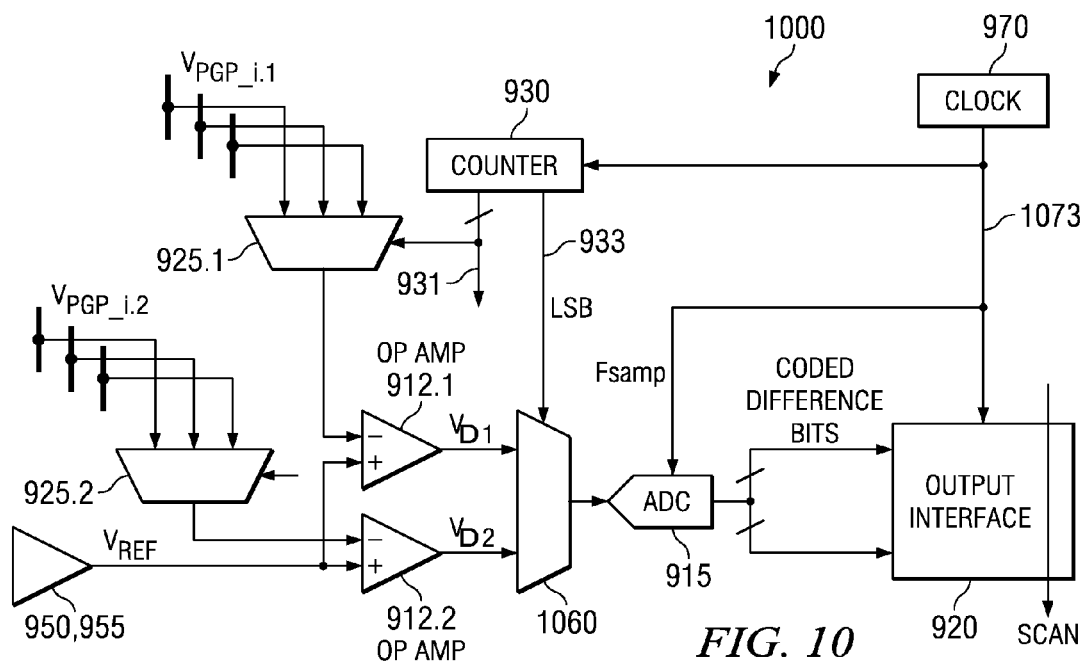
FIG. 10 is a block diagram of an inventive electronic monitoring circuit with an alternative form of input multiplexing and multiplexed conversion relative to FIG. 7.

In FIG. 10, routing lengths of tap lines to power grid points for voltage monitoring are reduced in some integrated circuits 10 by an embodiment 1000 that provides an input circuit including multiple op-amps 912.1 and 912.2 muxed by a 2:1 mux 1060 into the input of single ADC 915. Clock 970 provides sampling clock Fsamp to ADC 915 on the same clock line 1073 that runs the counter 930. Clock 970 and counter 930 can operate at the same rate as in FIG. 9. Mux 1060 has a selector line driven by the least significant LSB line 933 from counter 930. Counter driven muxes 925.1, 925.2 have their selector inputs parallel-driven by the all the count lines 931 from counter 930 except LSB line 933. That way, each of counter driven muxes 925.1, 925.2 cycle through their respective half of the power-grid points in the same amount of time as in FIG. 9. The output from the single ADC 915 goes to an output interface 920 of any suitable type such as described in other Figures herein. One example for an interface 920 is a pair of output muxes that distribute n-wide outputs and clock from line 1073 round-robin to enough shift registers sets 920.$i$.1, .2, etc. to deliver IR-drop information as output corresponding to all the taps 30.$i$. Scan-out delivers test results to the tester 890.

Figure 10A:
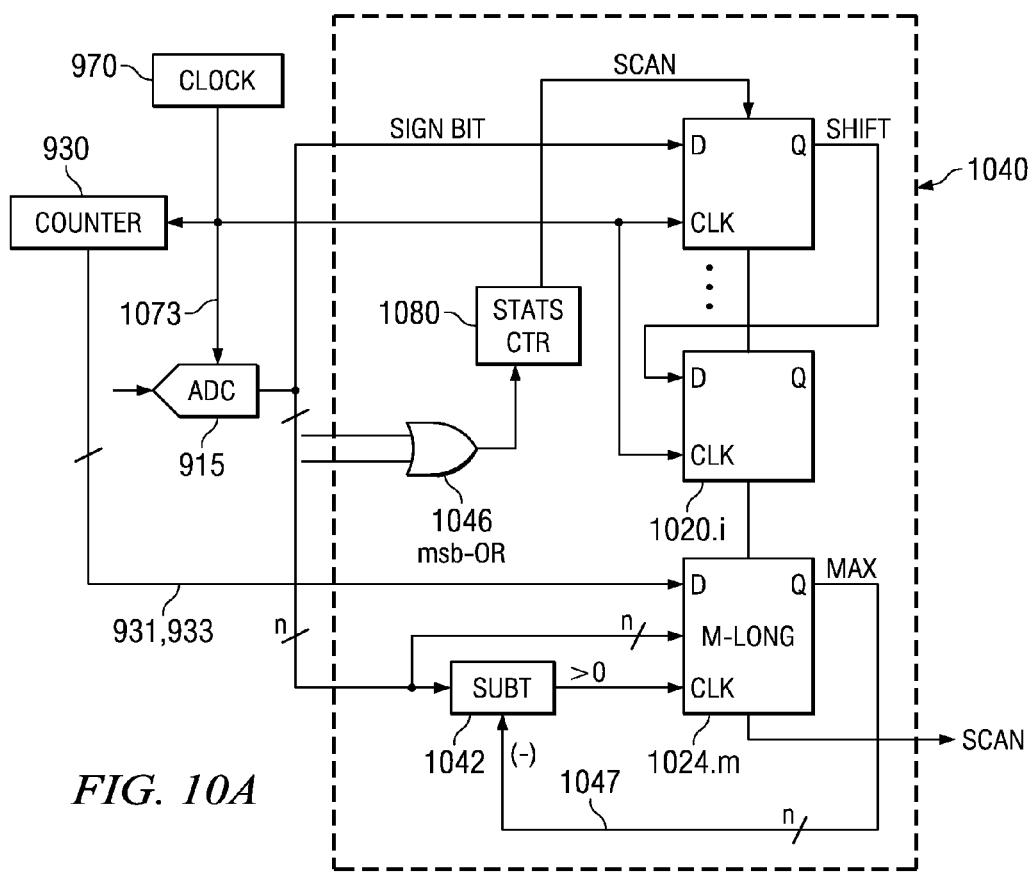
FIG. 10A is a block diagram of an inventive electronic monitoring circuit with multiple statistical capture and alternative form of output circuit relative to FIG. 7.

In FIG. 10A, a particular embodiment for an output interface 1040 is suitably provided in place of output interface 920 in FIG. 10. ADC 915 provides a sign bit to a specific shift chain of register cells 1020 so that excessive departures of power grid point voltages $V_{PGP,i}$ below the reference voltage $V_{REF}$ are individually entered by shifting them along register cells 1020.$i$ in a shifting process that is distinct from scan-out and occurs before scan out begins. Concurrently, a statistics counter 1080 is incremented by each instance of an excessive IR-drop, as indicated by an OR-gate 1046 responding to at least one 1 (one) among a predetermined set of most significant bits (msb's) of the output of ADC 915. If desired, additional scannable statistics counters 1080.1, 1080.2 etc. can be provided and respectively fed with OR-gate circuitry 1046 outputs representing OR's for more and more msb's from ADC 915. In some other embodiments, the msb-OR gate 1046 is replaced with a configurable register and logic to make the number of msb's to which the OR-ing responds be configurable. The count in statistics counter 1080 is not shifted into bit cells 1020.$i$ as the shifting of bit cells 1020.$i$ proceeds as above-described. The count in statistics counter 1080 is, however, included in a scan chain 1024.$m$, 1020.$i$, 1080 for scan-out ultimately to the tester 890. Advantageously as shown in FIG. 10A, the output lines of ADC 915 are thus employed in various numbers and in various ways concurrently, e.g., A) comparison result on single sign bit line from ADC, and B) msb-OR using fewer than all ADC output lines, and further C) a next-described maximum determination that can involve all the ADC output lines as the cycling through all the power grid points proceeds.

In FIG. 10A, a maximum IR-drop detector is provided by a subtracter 1042 and a set of scannable register D-flip-flop cells 1024.$m$. All the n digital lines carrying the output from ADC 915 are provided to subtracter 1042 and to n respective data D inputs of fewer than all of the bit cells 1024.$m$. These n digital lines provide ADC 915 output bits representing a currently-given voltage difference ($V_{REF}$−$V_{PGP,i,j}$). The data D inputs of the rest of the bit cells 1024.$m$ respectively receive all the counter lines 931, 933 in parallel from counter 930. Recall from FIG. 10 that lines 931 represent a current count i that points to the power grid point having voltage $V_{PGP\ldots i,1}$ or $V_{PGP\ldots,2}$ identified by the current state of LSB line 933 in FIGS. 10 and 10A. All the lines to register bit cells 1024.$m$ total M in number and together include the counter lines 931, 933 and the n ADC output lines. Subtracter 1042 determines whether the value represented by ADC 915 output currently exceeds a previously stored existent value in the subset of register 1024.$m$ register bit cells that are fed by the n ADC output bits. That existent value is fed back from those n register bit cells on n-wide line 1047 to a subtractive input (−) of subtracter 1042. When subtracter 1042 detects a difference greater than zero, subtracter 1042 supplies an active output to strobe inputs CLK whereupon to enter latest data D into all M of the register 1024.$m$ register bit cells and for the data to register as their latest outputs Q. Subtracter 1042 thus updates the register bit cells 1024.$m$ with both a largest yet-encountered value of the n-wide output of ADC 915 and the present count in counter 930 that points to the currently-applicable power grid point monitored by ADC 915. In this way, when the counter 930 has cycled through all the power grid points to be monitored, the register 1024.$m$ register bit cells (M-long) hold both the maximum difference ($V_{REF}$−$V_{PGP,i}$) that was presented to ADC 915 as well as the counter 930 count that points to a power grid point that experienced that maximum difference condition. (Simply reversing the inputs of subtracter 1042 conveniently finds the minimum and its identifying grid point count.) Subsequently, the scan chain 1024.$m$, 1020.$i$, 1080 is scanned out, and the results are analyzed by tester 890. In the particular circuit embodiment illustrated in FIG. 10A, the scan-out brings out M-long max determination and its location count first, then the IR-drop comparisons 1020.$i$ in the same order they were specified by the counter 930, and then the count value in statistics counter 1080.

Figure 11:
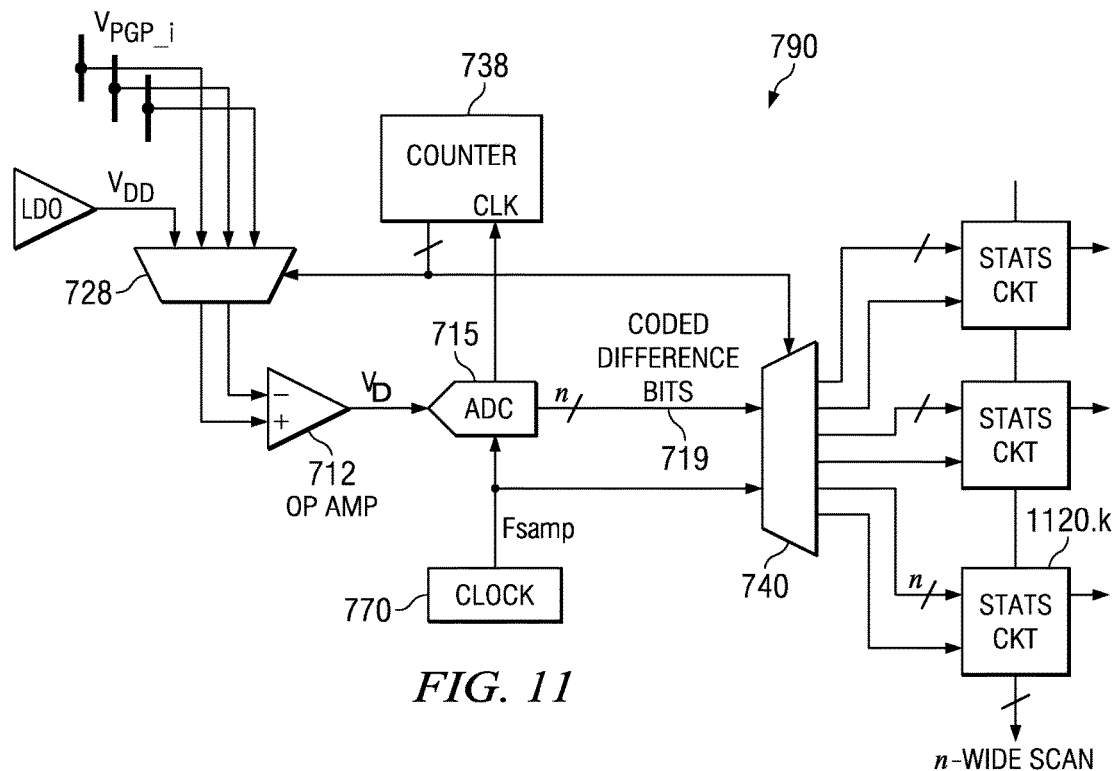
FIG. 11 is a block diagram of an inventive electronic monitoring circuit with multiple statistical capture and alternative form of output circuit relative to FIG. 7.

In FIG. 11, a further circuit embodiment somewhat resembles that of FIG. 7A, for instance, in providing voltage differences by counter-driven muxing to op-amp 712 and then conversion by ADC 715. By contrast with FIG. 7A output circuitry, the circuit of FIG. 11 provides either in combination or in substitution a set of statistics circuits 1120.$k$ corresponding to sets k of one, some or all the power grid points 30.$i$. Statistics circuits 1120.$k$ can be arranged to have a subcircuit that accumulates voltage $V_A$ values over a period of time to obtain a value proportional to an average of values during a time window. Such subcircuit can be provided in digital form after ADC 715 or in analog form before ADC 715 or distributed in whatever manner provides desired advantages. Another type of sub-circuit is adapted to detect maximum and/or minimum voltage difference (see FIG. 10A discussion) between power grid points during a time window, or across a set of grid points, or some other statistics. Multiple samples from a power grid point are taken during a time window by arranging clock 770 with Fsamp clocked fast and counter 738 clocked slower. Multiple power grid points are sampled successively during another time window by arranging clock 770 with Fsamp and counter 738 clocked at one rate and by mux 740 selector driven with only MSBs from counter 738. That way, mux 740 allows mux 728 and ADC 715 to provide samples from two or more power grid points during such latter time window before mux 740 advances. Various modes of operation are thus used to populate the statistics circuits or counters with various types of information. The statistics circuitry described for FIG. 11 can also be applied to enhance circuits of the other Figures herein besides FIG. 7A.

Figure 12:
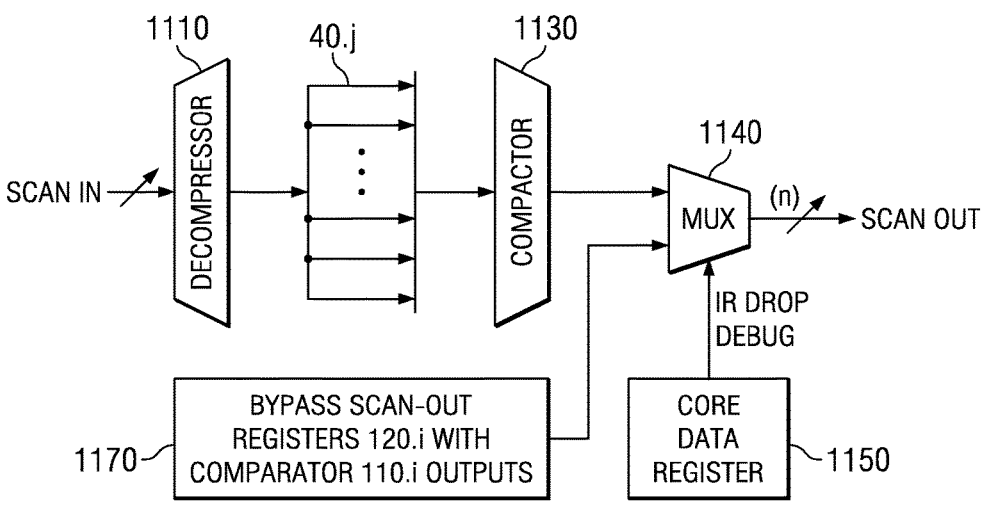
FIG. 12 is a block diagram of an inventive architecture integrating any of the inventive electronic monitoring circuits of the other Figures with a Decompressor-Compactor (CoDec) form of testability architecture.

Description next turns to FIG. 12. In the integrated circuit field, scan testing involves introducing sequences of ones and zeros, called scan bits, into the integrated circuits for testing them. Scan compression is a way of reducing the volume of such bits sent from the tester to an integrated circuit.

By way of introduction to FIG. 12, scan compression architecture can include:
1. Decompressor: Decompresses input channel data into internal scan-ins. (A respective scan channel pertains to any given set of scan chains among a number of such sets that make up all the scan chains in the integrated circuit.) Different decompressor architectures are available in the industry, e.g. XOR decompressor, mux/demux decompressor, LFSR (Linear Feedback Shift Register) based decompressor.
2. Compactor/Compressor: Compresses internal scan-outs data into output channels. Different compressor architectures are available in the industry for e.g. XOR compressor, and MISR (Multiple Input Signature Register) based compressor.
3. Control logic programming can be done through ATPG (if control logic is getting input data from decompressor or from top level input channels) or through external interface like IEEE 1500 scan interface of FIG. 8, etc.

In FIG. 12, test tool 890 scan-in to a Decompressor 1110 is controllably fanned out to any set of some or all of (N) internal scan chains 40.*j*. A test mode runs the chip 10 and the results of test are fed out from internal scan chains 40.*j* to a Compactor 1130. Compactor 1130 provides its serial output to a first input of a multiplexer 1140. The second input of the multiplexer 1140 is fed by an output block 1170, e.g., FIG. 1B registers 120.*i* connected in cascade and clocked collectively as an additional scan chain or serial shift register 1170 for serial scan-out of the comparator 110.*i* outputs. Put another way, the circuit 100.*i* of FIG. 1B is replicated and spread across the device, and the output of the registers 120.*i* is read out through mux 1140 in any suitable manner parallel or serial to identify whether the IR drop at any particular location i is more than expected or not. Other embodiments instead provide monitoring circuitry of other Figures herein and scan their IR-drop test results out through mux 1140. In another type of embodiment, the voltage monitoring or IR-drop monitoring circuitry of any of the Figures herein is scanned out and compacted through compactor 1130 itself.

Notice that IR drop can be measured as voltage-to-common, or as voltage difference between supply VDD and the voltage $V_{PGP}$, whichever be desired, either by analog or digital subtraction on chip 10 or at the tester 890, by referencing the analog voltage reference circuit 150 to common or to supply VDD. When only the comparison is desired, the comparator can be arranged to provide high active and low inactive or conversely high inactive and low active.

Multiplexer 1140 has a selector input controlled by at least one control bit of a core data register 1150 to select either the first input or the second input of the multiplexer 1140 for serial output from the integrated circuit 10 to the test equipment 890. The reference voltage $V_{REF}$ to each comparator 110.*i* is suitably controlled in some embodiments by different trim steps as in FIG. 13, and the outputs from the various registers 120.*i* are compared with each other and analyzed to determine which sections of the chip or locations on the chip have higher IR drop.

The reference voltages for the different points in the FIG. 1A power grid 20 are suitably supplied from a single analog voltage reference 150. Thus a single voltage reference 150 is applied to support multiple power grid locations, thus not unique per power grid location, so that circuit real estate is efficiently used on the chip. The analog voltage reference can be trimmed based on inputs from a JTAG/1500 Core Data Register (CDR) 840 of FIG. 8. If desired, some embodiments include more than one analog voltage reference, e.g., 150.0, 150.1 to handle opposite ends of the chip. In these and some other embodiments, the various IR test points are handled in parallel in the trimming process as well, and the loop in FIG. 13 is suitably parallelized to accomplish the parallelism.

In a chip, different locations might have different IR drop values, but in some embodiments the basic FIG. 1B circuitry 100.*i* used is made identical in all the different power grid locations for design-for-test (DFT) simplicity, uniformity and efficiency. The embodiments are applicable at all chip fabrication process nodes such down to 45 nm, 28 nm and as much further as desired.

In some integrated circuit embodiments, the IR drop circuits 100.*i* are placed, located and situated in different locations based on different power domains of the chip 10 and at interior points therein where substantial IR drops and worst case IR drop might be likely to occur. The locations on the power grid where the substantial IR drops and worst case(s) of IR drop observably do occur are desirably identified based on the output read from the scanned out data from the comparator output registers 120.*i*. Analogous discussion pertaining to use of circuits of other Figures herein takes account of similarities and differences of those Figures relative to FIG. 1B and each other.

Figure 13:
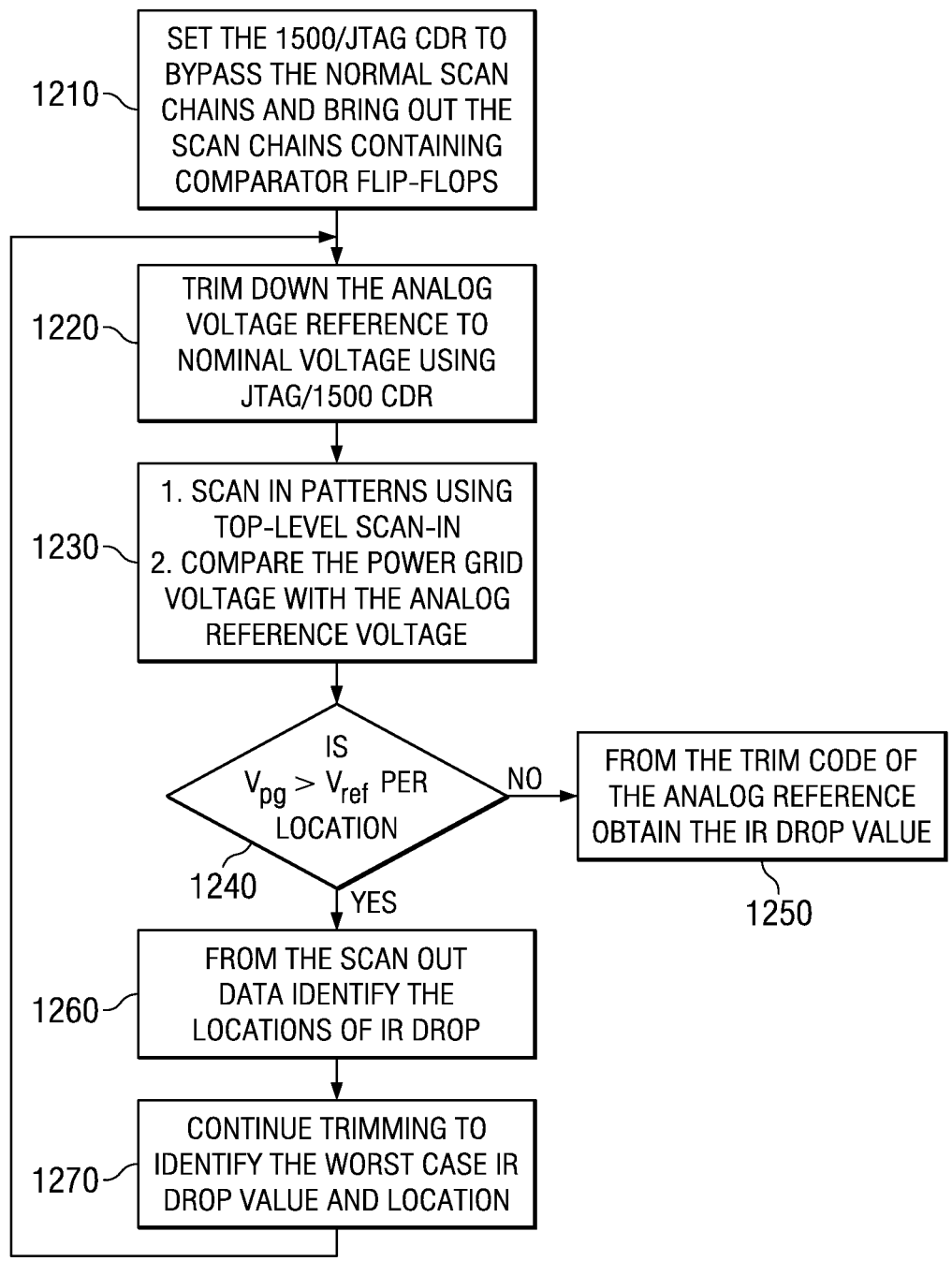
FIG. 13 is a flow diagram of an inventive test process for production of integrated circuits and operating inventive electronic monitoring circuits shown in the other Figures.

In FIG. 13, process embodiment commences with a step 1210 that sets a 1500/JTAG CDR (core data register) to bypass the normal scan chains and bring out the scan chains containing comparator flip-flops 120.*i* of FIG. 1B or analogous scannable flip-flops in other Figures. A step 1220 trims down the analog voltage reference to a nominal voltage using JTAG/1500 CDR. A succeeding step 1230 scans in patterns using top-level scan-in and then compares the power grid voltage with the analog reference voltage. A decision step 1240 determines whether $V_{PG} > V_{REF}$ on a per-location basis across the test points 30.*i* in the chip 10. If No (i.e., not $V_{PG} > V_{REF}$) then a step 1250 obtains the IR drop value from the trim code itself of the analog reference. Otherwise (Yes), operations proceed from decision step 1240 to steps 1260 and 1270. Step 1270 in FIG. 13 continues trimming to identify the worst case IR drop value and location and uses a loop back to step 1220, the execution of all of which identifies the locations of IR drop from the scan out data, e.g., from the FIG. 12 scan chain 1170. An embodiment of improved tool 890 herein is provided with a table that correlates or maps the scan registers 120.*i* to particular points on the design place-and-route layout data base and to particular points on the design netlist. Further, an analysis process embodiment as discussed for FIG. 1C is suitably implemented in tool 890.

In FIGS. 1A and 13, an IR drop monitoring circuit or at least a tap for such monitoring circuit is placed in different locations 30.*i* based on different power domains. The location on the power grid 20 where the worst case IR drop occurs is identified based on the output read from the scanned out data from the comparator output registers 120.*i*.

So in case the test-case or use case accesses a particular memory or logic region repeatedly, the test operator or automated test tool 890 program dynamically itself can focus the debug by reading out that register 120.*i* (or multiple nearby registers 120.*i* when provided) for the particular region either through JTAG access or through the scan out data. The most pertinent grid points 30.*i* are taken as the center (physical location from layout) of a power domain or can be determined or established based on some sample IR drop analysis done using a suitable circuit analysis method or tool. The resulting hot spots identified or predicted from the tool are used as design input to identify the approximate locations where the power grid monitoring circuits, taps, or connections are to be hooked up or established in the DFT design and thereby provide satisfactory IR drop test coverage for a given set of test objectives for the integrated circuit to be fabricated for test and/or production.

Advantages and benefits include detection of the IR drop on-chip that helps reduce chip debug cycle time. The registers 120.*i* which store the comparator 110.*i* output values can be read out for any use case scenario. They can be made accessible through JTAG during functional scenario. In the case of ATPG (automated test pattern generation) they can be part of a separate scan chain as depicted in FIG. 12. And the scan chain 120.*i*, or more complex chains such as of FIG. 10A, can be scanned out in a debug mode to read back the values. Each register 120.*i* is suitably data gated such that once it registers a value to indicate that the drop is high (i.e., IR-drop excessive), it does not register the opposite value thereafter in the test run. In this way, a false positive is not registered. The circuits 100.*i* are respectively placed inside each individual power domain of the SOC (system on a chip 10) so that individual power domain related IR drop can be observed. Another important advantage of the circuit and process embodiments is that they can be used for multiple functional/test scenarios that cannot be planned for pre-silicon.

The embodiments provide or can provide beneficial impact in at least the following areas:
A) IR drop detection using silicon results.
B) Reduction in debug cycle time.
C) Isolation of issue to IR drop in case there is a silicon failure where IR drop is the problem.

The illustrated embodiments of structure and process are easy to implement and serve their purposes in a wide scope of use case scenarios, including scenarios in both test modes and functional modes. The embodiments are suitably re-used across test cases in test modes and re-used for functional modes to desirably identify and indicate regions and locations on the chip where IR drop is higher. In this way, uncertainty about IR drops in standard pre-silicon estimation flows is eliminated. And, in case of post-silicon failures in ATPG test cases (written in test design language scripts TDLs), the embodiments help identify and determine if and whether the failure is due to IR drop. The embodiments facilitate faster post-silicon debug.

The embodiments of circuitry and process have a wide reach of work or applicability. They can be re-used by any digital, mixed signal, or analog design team. The circuitry and processes work at chip level and cooperate with the tool to provide tool insight, in the sense of volume of electronic data and revealing analysis, into silicon issues without having to go through a big debug cycle. Tool 890 software and output to displays and otherwise helps test and verify proper operation of process and circuit embodiments. Proper operation of an embodiment can be tested by introducing a modest increase or decrease of supply voltage and comparing the results of scanning out scan chain 120.*i* with the results at a given initial supply voltage to detect whether the trimming increases or decreases.

Further in FIG. 13, the Nominal Voltage in step 1220 is set in a manner suitable for the circuit used. For example, if IR drop is measured as a voltage using multiple bits to represent it, then Nominal Voltage is suitably set at VDD or at zero, or at some other pre-established reference voltage. If a one-bit comparator circuit is used, then IR drop below VDD or above zero volts would occur at every grid point, so the voltage reference $V_{REF}$ is set, trimmed, or configured at some nominal voltage difference below VDD (and analogously for the embodiments with digital reference 416, 516, 616).

In FIG. 13, the process involves steps such as: Control the trim bits of the reference and set the reference voltage. Set the reference voltage to VDD, scan in the patterns. During or between the scan-in or scan-out operation and because of the toggling activity of circuits in operation, there is an IR drop in the power grid 20. And this will cause all the grid points 30.*i* (observation points using comparator 110.*i*) to be lower than reference voltage. Trim the reference voltage down by steps of 10 or 20 mV and repeat the process. The process finds the absolute value of the reference voltage $V_{REF}$ wherein the power grid voltage $V_{PGP}$ becomes lower than the reference voltage $V_{REF}$. At this point, the voltage difference VDD–Vref indicates the IR drop at that location of the power grid. The process is repeated to identify the worst case IR drop and the corresponding location.

In FIG. 13, a procedure of variable adjustment of the reference is suitably supported by varying the reference value in register 416 of FIG. 4 or in trim register 255 of FIG. 2. A control circuit 258 in some embodiments performs the variable adjustment of the reference on-chip. Alternatively, JTAG DR or 1500 CDR bits are suitably externally controlled to provide such variable bits. The adjustment process via register 416 or trim bits register 255 is suitably automatically controlled by trim control 258 such as 1) by a state machine operating an incrementer on-chip to set the trim value, or 2) by an incrementer on-chip to adjust the trim value up or down in response to an up/down command from the tester off-chip or from an on-chip microprocessor, or 3) by a command line delivering each latest trim value to the trim register from the tester off-chip, or 4) by multi-mode circuit providing any one or more of the foregoing or other types of operation as selectable modes.

Figure 14:
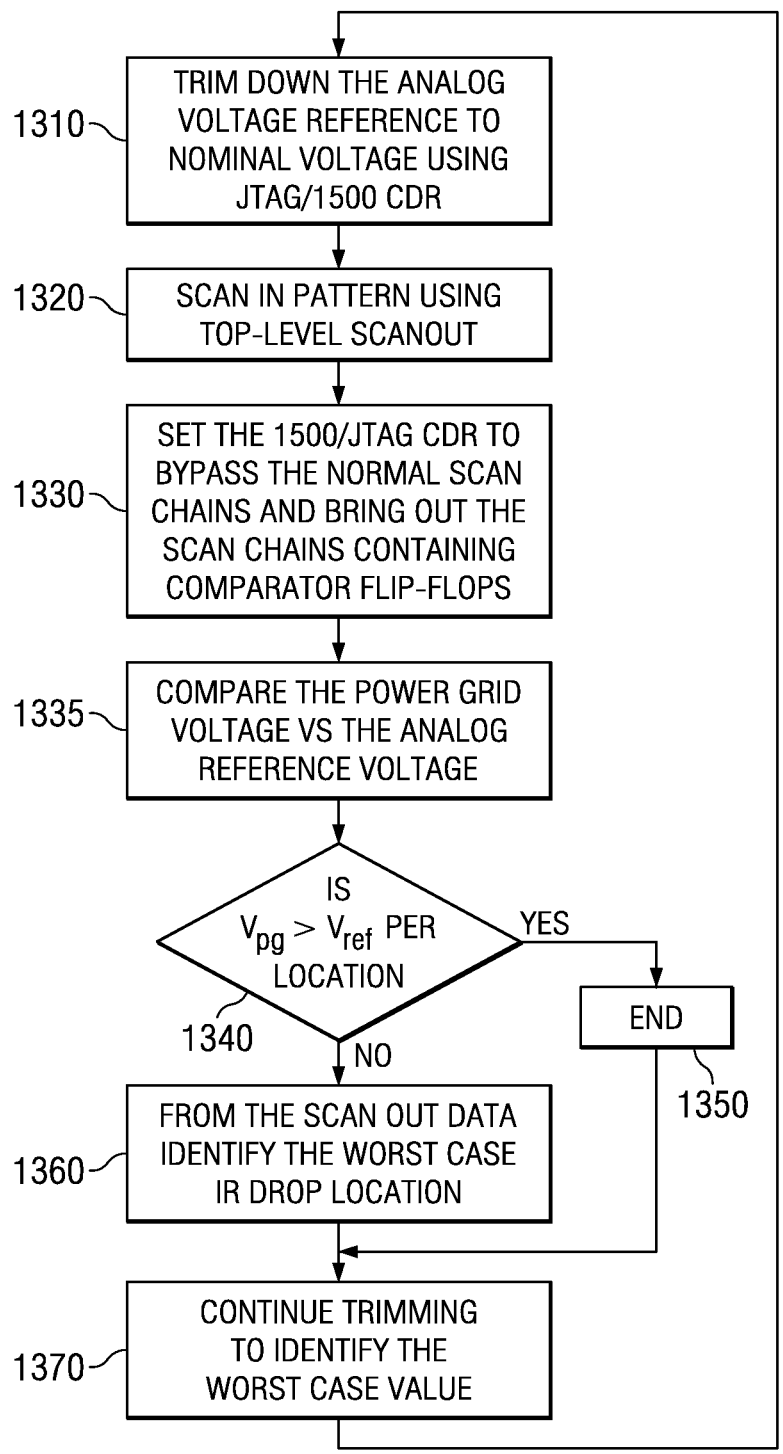
FIG. 14 is a flow diagram of another inventive test process for production of integrated circuits and operating inventive electronic monitoring circuits shown in the other Figures.

In the flow diagram of FIG. 14, another process embodiment commences with a step 1310 that starts from an initialized value such as $V_{DD}$ and decrements the reference voltage value once per loop. The process has cyclic loops that over time operate so that repetitions of step 1310 trims down the analog voltage reference to a nominal voltage. By nominal voltage for purposes of FIG. 14 is meant a value of trim bits register or reference voltage for use in a particular cycle of test; or in the overall test, nominal voltage ultimately means the greatest lower bound on reference voltage above which the voltages of all the power grid points being tested lie. A step 1320 then scans in patterns using top-level scan-in. A succeeding step 1330 sets a 1500/JTAG CDR (core data register) to bypass the normal scan chains 40.*j* and get ready to bring out the scan chain(s) containing comparator flip-flops 120.*i* of FIG. 1B or analogous scannable flip-flops in other Figures.

A further step 1335 then compares the power grid point voltage $V_{PGP}$ with the analog reference voltage $V_{REF}$. A decision step 1340 determines whether $V_{PGP} > V_{REF}$ on a per-location basis across the test points 30.*i* in the chip 10. If at step 1340 $V_{PG} > V_{REF}$, then a step 1350 ends this process cycle for that particular power grid point location. Otherwise (No at step 1340), operations proceed to a step 1360 that identifies the current location as worst case IR drop value and location so far. Such identification can be by any information such as grid point number, scan chain register position, or otherwise equivalent or mappable to grid point location. Put another way, step 1340 and step 1360 together determine whether each power grid point voltage exceeds the reference on a per-location basis across the test points and, if not, identify the currently-compared power grid point location as having lowest voltage value thus far in the process before comparing voltage at another power grid point location with the reference. A step 1370 in FIG. 14 continues trimming to identify any further worst case IR drop value and location until all the test points have been checked by the process. In step 1370, the trimming is continued, for instance, until all the comparison results are the same (e.g., grid points all above reference) to identify a worst case IR drop value as the test criterion. In step 1370, the process suitably accesses a mapping of the scan registers to power grid point locations and further stores as a test result at least one power grid point location having the worst case IR drop value.

For instance, with supply voltage $V_{DD}$ positive and power grid points IR-dropped down from $V_{DD}$, the worst-case IR drop can be determined by trimming down (decrementing) the reference voltage $V_{REF}$ and finding the value $V_{glb}$ of reference voltage $V_{REF}$ based on the trim code just at which all the power grid point voltages become greater than the reference voltage. That way, the difference between supply voltage $V_{DD}$ and the thus-found reference voltage indicates worst-case IR drop as a greatest lower bound $V_{glb}$.

The mapping of the scan registers to power grid point locations uses the comparison results from the loop cycle just-previous to the loop cycle that just determines the trim code for $V_{glb}$. Some embodiments scan out all the comparison results from every loop cycle and store them in the tester 890, and then access the previous loop cycle comparison results when the worst-case IR drop $V_{glb}$ is found on-chip. Some other embodiments store the previous loop cycle comparison results in shadow registers on-chip and scan them out in one single scan-out pass when the worst-case IR drop $V_{glb}$ is found.

Figure 15:
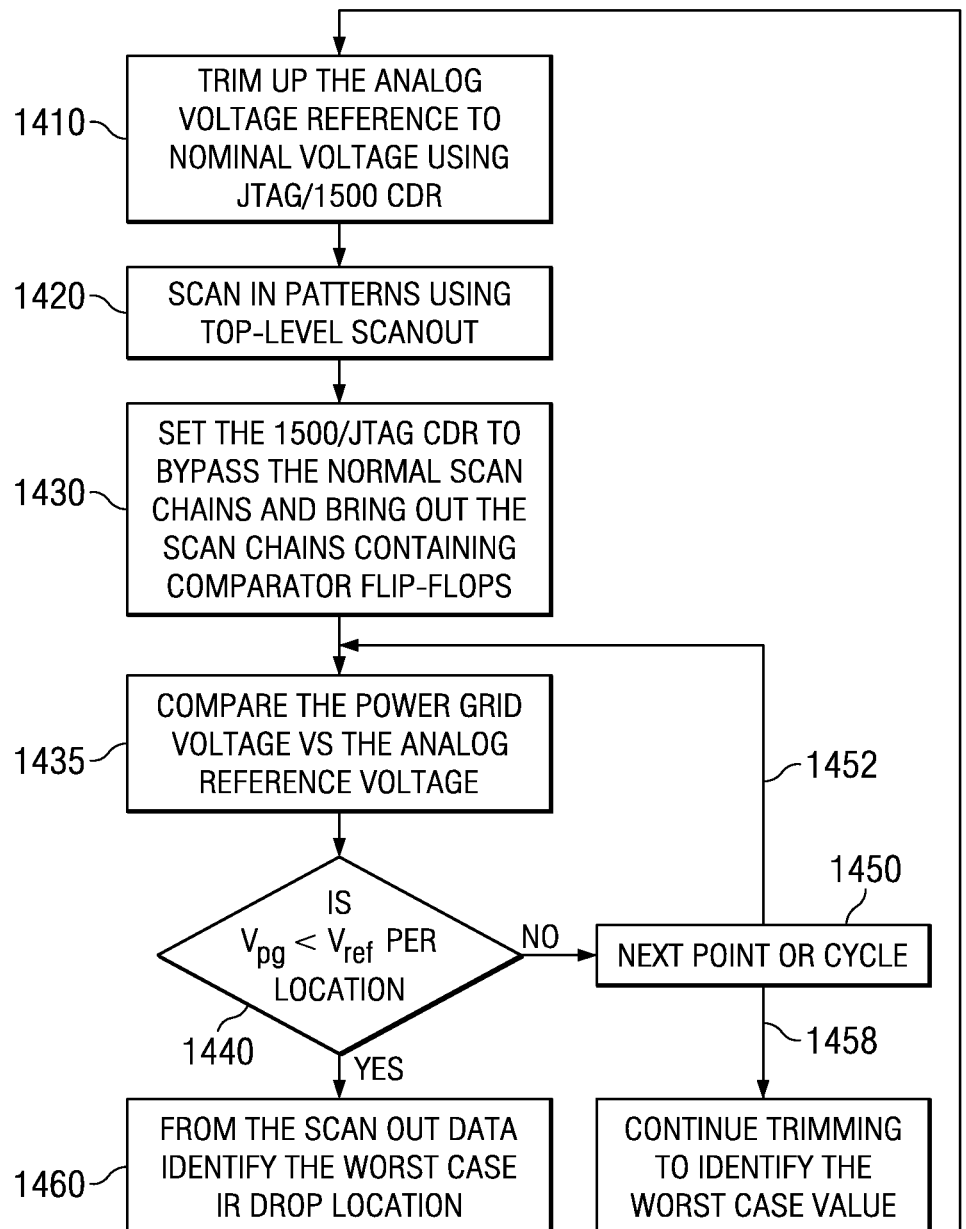
FIG. 15 is a flow diagram of still another inventive test process for production of integrated circuits and operating inventive electronic monitoring circuits shown in the other Figures.
Figure 15A:
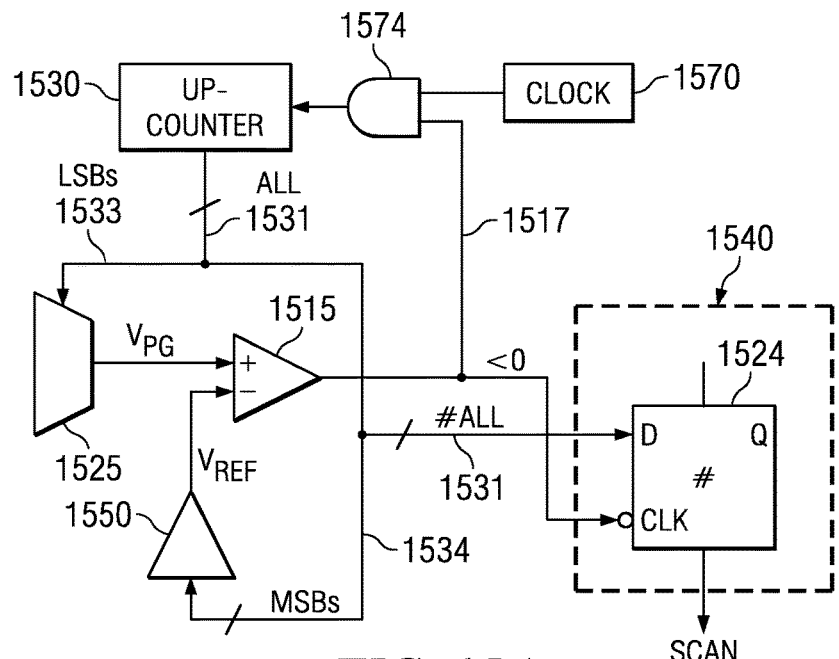
FIG. 15A is a block diagram of an inventive electronic monitoring circuit with an alternative form of capture and output circuit.

In FIG. 15, conversely, the worst-case IR drop can be determined by trimming up (incrementing) the reference (digital or analog) from some low initial value and finding the value of reference voltage based on the trim code just at which at least one of the power grid point voltages becomes less than the reference voltage. This process identifies the location of worst case IR drop value once the worst case IR drop value is itself determined. Then this latter method can also conveniently access any available mapping of the scan registers to power grid point locations using the comparison results from the same loop cycle as finds that just-determined trim code. In FIG. 15A, as described somewhat later hereinbelow, some embodiments in the output circuit omit outputting or loading individual voltage comparison results at worst case IR drop and instead simply output a counter value effectively identifying a location of worst case IR drop value.

Notice either way (varying reference by decrement or increment) that the IR-drop determination is approximate yet adequate due to granularity or coarseness of the adjustment, and due to either stopping just above or just below the actual greatest lower bound voltage depending on embodiment. The varying of the reference uses a search strategy that can, for instance, progressively trim in a direction of approach from above downward, or from below upward. Mapping of locations of excessive IR-drop with respect to a nominal voltage somewhat higher than the worst-case can identify physical portions of the wafer or die due for better fab process coverage, or can identify functional circuit sections or blocks than can be remediated for the chip by disablement or repair.

Detailing the flow diagram of FIG. 15, this process embodiment commences with a step 1410 that starts from an initialized value such as $V_{DD}/2$ (or other low starting value) and trims up or increments the reference voltage value once per loop. The process has cyclic loops that over time operate so that repetitions of step 1410 trims up the analog voltage reference (or digital configuration value) to worst-case IR drop voltage, such as using JTAG/1500 CDR loaded from tester or by an automatic circuit 258 to increment on-chip. By nominal voltage for purposes of FIG. 15 is meant a value of trim bits register or reference voltage for use in a particular cycle of test; or in the overall test, nominal voltage ultimately means the greatest lower bound on reference voltage above which the voltages of all the power grid points being tested lie (or one incrementation step higher in FIG. 15). A step 1420 scans in patterns using top-level scan-in. A succeeding step 1430 sets a 1500/JTAG CDR (core data register) in FIG. 12 to bypass the normal scan chains and get ready to bring out the scan chains containing comparator flip-flops 120.*i* of FIG. 1B or analogous scannable flip-flops in other Figures. A further step 1435 compares the power grid point voltage $V_{PGP}$ with the analog reference voltage $V_{REF}$. A decision step 1440 determines whether $V_{PGP} < V_{REF}$ on a per-location basis across the test points 30.*i* in the chip 10. If No at step 1440 ($V_{PG}$ is not less than $V_{REF}$), then a step 1450 loops back via flow line 1452 to step 1435 to voltage-compare the next power grid point. If at step 1450 all the power grid points are exhausted, operations go from step 1450 to step 1470 for a next process cycle to trim up the reference voltage. If Yes at step 1440) ($V_{PG}$ is less than $V_{REF}$), operations proceed to a step 1460 that identifies the current location as worst case IR drop value and location and the process is completed. Such identification can be by any information such as grid point number, scan chain register position, or otherwise equivalent or mappable to grid point location. Put another way, step 1440 and step 1460 together determine whether each power grid point voltage exceeds the reference on a per-location basis across the test points and, if not, identify the currently-compared power grid point location as having lowest voltage value and the trim code at this point identifies the worst case IR-drop. Notice at step 1450 that the FIG. 15 trimming is continued until at least one of the comparison results is not the same as all the others (e.g., grid points were all above reference and now at least one is below reference) to identify a worst case IR drop value as the test criterion. In step 1460, the process suitably accesses a mapping of the scan registers to power grid point locations and further stores as a test result at least one power grid point location having the worst case IR drop value.

Note further that where the supply voltage $V_{DD}$ for the integrated circuit is negative that terminology about decrementing and greatest lower bound refer to the voltage magnitude. Also, consider embodiments where the power grid point(s) voltage nears common (ground GND), as with IR-rise across FIG. 1C transistor 84 or by metallization IR-rise above ground at such power grid point. In such cases, finding least upper bound on voltage magnitude is suitably used instead to determine worst case IR rise. Furthermore, some embodiments reversely find the worst-case IR-drop or IR-rise at either the positive or negative supply side by starting with a nominal reference value initially farther in voltage from the applicable supply rail and between the supply rail voltages and incrementing or decrementing as the case may be until at least one power grid point voltage comparison result changes state. In various instances for different types of integrated circuits and power supply systems, the supply rail voltages might be any of (++, 0), (−−, 0), (0, ++), (0, −−), and less typically any of (+, ++), (++, +), (−−, −), (−, −−), (++, −), (−, ++), (−−, +), (+, −−) or perhaps some other combination of two or more supply voltages. Accordingly, various embodiments can be equivalent to one another regardless of the voltage direction of the decrementing or incrementing, and according to equivalent different ways, such as greatest lower bound and least upper bound, by which the comparison results are interpreted.

In some embodiments, the IR drop monitoring circuitry is set up to provide a break point so the functional circuit clock stops within a few cycles of some problematic scenario that caused a big IR drop in one or more of the IR drop circuits. Breakpoint hardware is provided on-chip and connected to or fed by the IR drop circuits and configured for intended operation.

In FIG. 15A, an on-chip hardware embodiment performs many of the operations of FIG. 15. A comparator 1515 has its non-inverting (+) input fed by a mux 1525 that selects each particular power grid point and passes its voltage $V_{PG}$ to comparator 1515. An up-counter 1530 provides a set of counter lines 1531 that include less-significant-bit (LSB) counter lines 1533 that make a power grid point selection "xxxxxx" for mux 1525, as well as more-significant-bit (MSB) counter lines 1534 that make a trim code selection for reference voltage generator 1550. Clock 1570 actuates up-counter 1530 via a normally-enabled (qualified) logic such as an AND-gate 1574. $V_{REF}$ generator 1550 supplies a low voltage, such as VDD/2 or some other choice, at a low trim code such as '00000'. At first as up-counter 1530 goes through power grid points, it supplies '00000xxxxxx', which means that the trim code is '00000' for all the successively-counted power grid points '000000' through '111111'. Next, as up-counter 1530 goes through power grid points, it supplies '00001xxxxxx', which means that the trim code is '00001' for all the successively-counted power grid points. This process continues cycling by such up-counting until comparator 1515 goes low for a power grid point (say, e.g., '001011' on LSBs 1533) that is encountered at some trim code (e.g., '01110' on MSBs 1534). The output low from comparator 1515 signifies that the difference ($V_{PG}$−$V_{REF}$) is negative (i.e., <0). The output low from comparator 1515 disqualifies AND-gate 1574, which freezes or stops the counting by up-counter 1530. Also, the output low from comparator 1515 strobes a low-active CLK input of a scan register 1524 that receives all the counter lines 1531. Scan register 1524 has a number of register cells that is at least as numerous as the combined number (#ALL) of MSB lines 1534 and LSB lines 1533 from up-counter 1530. Thus, scan register 1524 enters both the trim code '01110' on MSBs 1534 and the grid point count '001011' from the LSB lines 1533. In this way, a location identification is provided to identify at least one power grid point having the worst IR-drop (or near it) together with the trim code representing that IR-drop, by the counter 1530 value (e.g., '01110001011') at which comparator 1515 stopped the count. The embodiment of FIG. 15A in this way provides a real estate efficiency and some test data compression. For instance, if $2^n$ power grid points are monitored and $2^m$ trim codes can drive reference voltage 1550, then the output circuit 1540 can identify one of the power grid points and one of the trim codes with only (n+m) number (#) of output bits. Since, the circuitry in FIG. 15A is muxed or re-used to monitor all the $2^n$ powergrid points, the real estate economy is appealing also.

Some other embodiments related to FIG. 15A can also obtain any additional counter 1530 values identifying power grid points having excessive IR-drops on the entire final loop pass. For example, a further flip-flop (not shown) is provided and set active when comparator 1515 first goes low, and is connected with additional NAND logic to disable AND-gate 1574 in response to final LSBs '111111' and that flip-flop active. Any counter 1530 values for which comparator 1515 goes low anytime during the entire final loop pass are strobed into a circular buffer in place of register 1524 for analysis. Some embodiments have successively-operative modes and combine a mode that operates such worst-case IR-drop circuitry of, or related to, FIG. 15A with circuitry of other Figures herein. One example of a second mode applies a nominal reference $V_{REF}$ set judiciously higher than and based off the worst-case value found in FIG. 15A, and it scans out all the comparison results for the whole mosaic of monitored power grid points.

Figure 16:
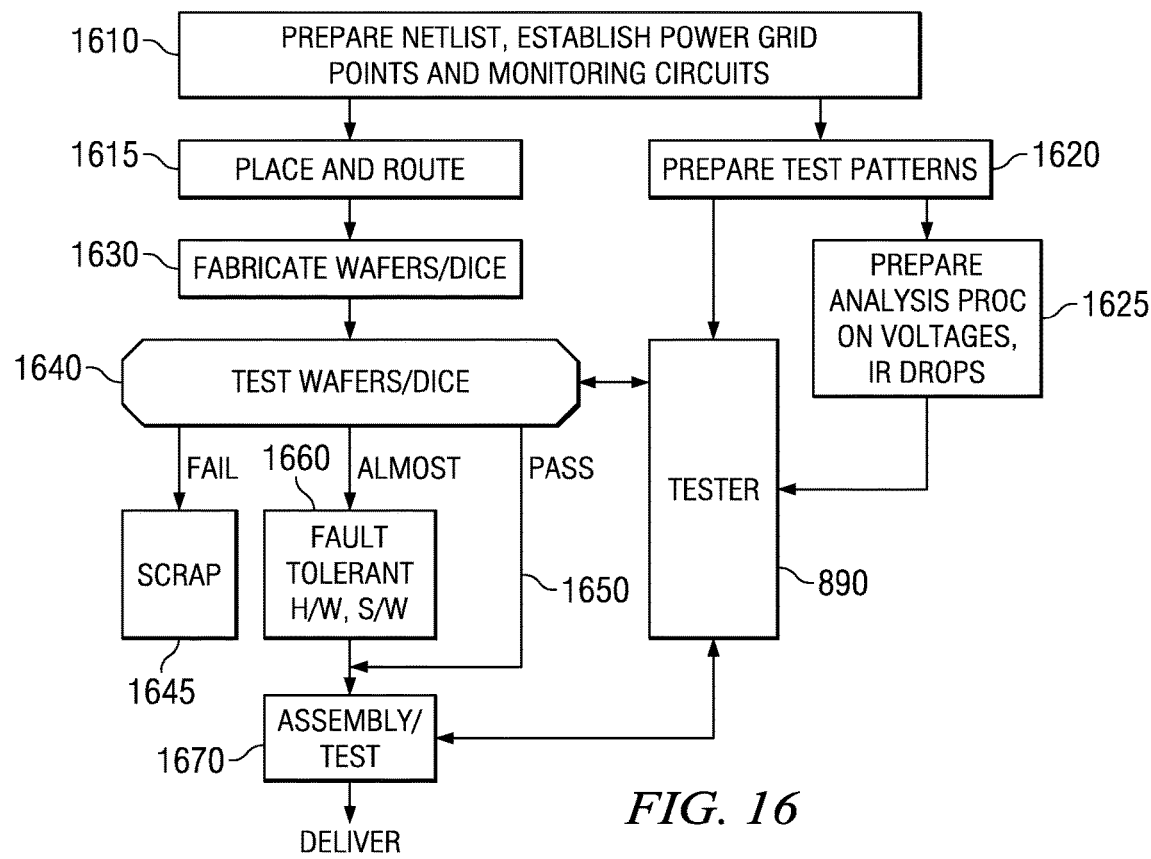
FIG. 16 is a flow diagram of an inventive manufacturing production process making or employing structures and processes as shown in the other Figures.

Turning to FIG. 16, operations in an integrated circuit manufacturing process embodiment include a design step 1610 that prepares a functional netlist. In the functional netlist, power grid points to and/or inside major power consuming blocks are established or identified. Then as part of step 1610, monitoring circuits are added to the netlist near each established point as in FIG. 1B. Alternatively, as in FIG. 2 or other Figures, one or more shared monitoring circuits having lines to each tap point 30.i are established by step 1610 and included in the netlist. Design operations proceed to a step 1615 for place-and-route to lay out and specify all dimensions and parameters for structures in the integrated circuit 10. Concurrently, test operations proceed to a step 1620 to prepare test patterns for a tester such as FIG. 8 tester 890. A further step 1625 prepares an analysis procedure involving voltage, voltage drop, and/or current (per-unit or actual) to the extent desired to reduce raw data from the chip to intelligent conclusions about its operational adequacy, such as discussed earlier hereinabove with FIG. 1C. Step 1625 uses information from any one or more of the netlist from step 1610, the place and route information from step 1615, and the test patterns 1620. In the meantime a step 1630 fabricates wafers for wafer test and/or cuts the wafers into integrated circuit dice for die test. Tester 890 applies test patterns from step 1620 to one or more wafers for one or more IC dies as DUTs. Monitoring circuits as described in one or more of the other Figures herein operate in a step 1640 to perform internal on-chip test operations. The on-chip test operations, such as the electronic monitoring of FIG. 13, 14 or 15 and/or of any of the test circuit Figures herein, return information to the tester 890, which is analyzed according to the analysis procedure of step 1625. On the basis of the information provided by step 1640 as so analyzed, a given die fails and is scrapped at step 1645, or it passes as indicated by flow line 1650. Or, the test may indicate the die is sufficiently satisfactory so that the flow passes to hardware or software operations of a step 1660 that provides fault tolerance, fault disablement or avoidance, fault repair, or other fault-based analysis or remediation measures, whereupon the die passes. Assembly step 1670 packages each die and final test is suitably performed at step 1670 as well, e.g., analogous to step 1640.

The compressed scan chain diagnostic circuitry facilitates testing of operations in RISC (reduced instruction set computing), CISC (complex instruction set computing), DSP (digital signal processors), microcontrollers, PC (personal computer) main microprocessors, math coprocessors, VLIW (very long instruction word), SIMD (single instruction multiple data) and MIMD (multiple instruction multiple data) processors and coprocessors as cores or standalone integrated circuits, and in other integrated circuits and arrays. The compressed scan chain diagnostic circuitry is useful in other types of integrated circuits such as ASICs (application specific integrated circuits) and gate arrays and to all circuits with structures and analogous problems to which the advantages of the improvements described herein commend their use.

In addition to inventive structures, devices, apparatus and systems, processes are represented and described using any and all of the block diagrams, logic diagrams, and flow diagrams herein. Block diagram blocks are used to represent both structures as understood by those of ordinary skill in the art as well as process steps and portions of process flows. Similarly, logic elements in the diagrams represent both electronic structures and process steps and portions of process flows. Flow diagram symbols herein represent process steps and portions of process flows in software and hardware embodiments as well as portions of structure in various embodiments of the invention.

ASPECTS (See Notes Paragraph at End of this Aspects Section.)

11A. The integrated circuit claimed in claim 11 wherein said multi-bit output interface includes a scannable register having at least two register bit cells respectively coupled to the output of said digital circuit.

11B. The integrated circuit claimed in claim 11 wherein said multi-bit output interface includes a test wrapper circuit on-chip.

19A. The integrated circuit claimed in claim 19 wherein said analog reference includes a voltage reference generator circuit.

21A. The integrated circuit claimed in claim 21 wherein said wherein said multi-bit output interface includes an output multiplexer with selector control lines shared with said input multiplexer circuit.

21B. The integrated circuit claimed in claim 21 further comprising a clock circuit, said analog to digital converter circuit having a sampling control input and said input multiplexer having a selector control input, the sampling control input and the selector control input both coupled with said clock circuit.

21C. The integrated circuit claimed in claim 21 further comprising a second input circuit having a first input coupled to at least one of a second set of power grid points and having a second input at least sometimes fed by said analog reference, said second input circuit having an output also coupled with said analog to digital converter circuit.

21D. The integrated circuit claimed in claim 21 wherein said multi-bit output interface includes plural statistics circuits and an output multiplexer coupling said analog to digital converter circuit to said plural statistics circuits.

27A. The process claimed in claim 27 further comprising reading out the scan registers and at least temporarily storing the comparison results, whereby to test operation of the integrated circuit under a given functional use scenario specified by the scan pattern.

27B. The process claimed in claim 27 wherein the reference relates to a digital code, and wherein the comparing includes determining whether each power grid point voltage exceeds the reference on a per-location basis across power grid points and, if so, then obtaining an IR drop reference value from at least one value of the digital code itself.

27C. The process claimed in claim 27 further comprising identifying locations of excessive IR drop in response to the comparison results.

27D. The process claimed in claim 27 wherein the comparing includes determining whether each power grid point voltage exceeds the reference on a per-location basis across the test points and, if not, identifying the currently-compared power grid point location as having lowest voltage value thus far in the process before comparing voltage at another power grid point location with the reference.

27E. The process claimed in claim 27 further comprising initially setting the reference, prior to the comparing, to a nominal voltage below supply voltage for the integrated circuit used.

27F. The process claimed in claim 27 further comprising introducing a change of supply voltage for the integrated circuit, repeating the process, and determining whether a value representing the reference thus varied changes approximately correspondingly, whereby to self-check the process.

27G. The process claimed in claim 27 wherein the varying includes repeatedly adjusting a voltage as the reference by steps of approximately ten to twenty millivolts and repeating the comparing.

29A. The process claimed in claim 29 further comprising accessing a mapping of the scan registers to power grid point locations and further storing as a test result at least one power grid point location having the worst case IR drop value.

35A. The process claimed in claim 35 wherein the measuring includes measuring the voltage for the different power grid points differentially.

35B. The process claimed in claim 35 further comprising multiplexing the voltage for different power grid points prior to the measuring.

35C. The process claimed in claim 35 wherein the measuring includes analog-to-digital converting the voltage for different power grid points.

35D. The process claimed in claim 35 further comprising accessing a mapping of the scan registers to power grid point locations and storing as a test result at least one power grid point location having a problematic measured voltage condition.

39A. The manufacturing process claimed in claim 39 further comprising operating one or more of the power voltage monitoring circuits on a shared basis from different power grid points prior to the scanning out of the information.

Notes about Aspects above: Aspects are paragraphs which might be offered as claims in patent prosecution. The above dependently-written Aspects have leading digits and internal dependency designations to indicate the claims or aspects to which they pertain. Aspects having no internal dependency designations have leading digits and alphanumerics to indicate the position in the ordering of claims at which they might be situated if offered as claims in prosecution.

Processing circuitry comprehends digital, analog and mixed signal (digital/analog) integrated circuits, ASIC circuits, PALs, PLAs, decoders, memories, and programmable and nonprogrammable processors, microcontrollers and other circuitry. Internal and external couplings and connections can be ohmic, capacitive, inductive, photonic, and direct or indirect via intervening circuits or otherwise as desirable. Process diagrams herein are representative of flow diagrams for operations of any embodiments whether of hardware, software, or firmware, and processes of manufacture thereof. Flow diagrams and block diagrams are each interpretable as representing structure and/or process. While this invention has been described with reference to illustrative embodiments, this description is not to be construed in a limiting sense. Various modifications and combinations of the illustrative embodiments, as well as other embodiments of the invention may be made. The terms including, having, has, with, or variants thereof are used in the detailed description and/or the claims to denote non-exhaustive inclusion in a manner similar to the term comprising. The appended claims and their equivalents are intended to cover any such embodiments, modifications, and embodiments as fall within the scope of the invention.

What is claimed is:

1. An integrated circuit comprising:
   a functional circuit having power grid points; and
   an electronic monitoring circuit including
      an analog reference;
      an input circuit having a first input coupled to at least one of said power grid points and having a second input at least sometimes fed by said analog reference;
      an analog to digital converter circuit fed by said input circuit, said analog to digital converter producing an output; and
      a multi-bit output interface fed from said analog to digital converter.

2. The integrated circuit claimed in claim 1 wherein said input circuit is structured to provide an output as a function of the difference of voltages at its first and second inputs.

3. The integrated circuit claimed in claim 1 further comprising an input multiplexer circuit having inputs coupled respectively to at least some of said power grid points and an output coupled to the first input of said input circuit.

4. The integrated circuit claimed in claim 3 further comprising a control circuit coupled to operate said input multiplexer circuit to progressively select power grid points at least one at a time.

5. The integrated circuit claimed in claim 3 wherein said input multiplexer circuit also has an input for said analog reference and has a second output, said input multiplexer circuit coupled via the two outputs to feed selected inputs pairwise to the first and second inputs of said input circuit.

6. The integrated circuit claimed in claim 3 wherein said multi-bit output interface includes at least one statistics circuit and an output multiplexer coupling said analog to digital converter circuit to said multi-bit output interface.

7. The integrated circuit claimed in claim 3 further comprising an output multiplexer coupling said analog to digital converter circuit to said multi-bit output interface, and a control circuit coupled to operate said input multiplexer circuit and said output multiplexer circuit in coordination with each other.

8. The integrated circuit claimed in claim 1 wherein said multi-bit output interface includes an output multiplexer.

9. An integrated circuit comprising:
   a functional circuit having power grid points; and
   an electronic monitoring circuit including
      an analog reference;
      an input circuit having a first input coupled to at least one of said power grid points and having a second input at least sometimes fed by said analog reference, wherein said input circuit is structured to provide an output as a function of the difference of voltages at its first and second inputs;
      an analog to digital converter circuit fed by said input circuit, said analog to digital converter producing an output; and
      a multi-bit output interface fed from said analog to digital converter.

10. The integrated circuit claimed in claim 9 further comprising an input multiplexer circuit having inputs coupled respectively to at least some of said power grid points and an output coupled to the first input of said input circuit.

11. The integrated circuit claimed in claim 10 further comprising a control circuit coupled to operate said input multiplexer circuit to progressively select power grid points at least one at a time.

12. The integrated circuit claimed in claim 10 wherein said input multiplexer circuit also has an input for said analog reference and has a second output, said input multiplexer circuit coupled via the two outputs to feed selected inputs pairwise to the first and second inputs of said input circuit.

13. The integrated circuit claimed in claim 10 wherein said multi-bit output interface includes at least one statistics circuit and an output multiplexer coupling said analog to digital converter circuit to said multi-bit output interface.

14. An integrated circuit comprising:
   a functional circuit having power grid points; and
   an electronic monitoring circuit including
      an analog reference;
      an operational amplifier having a first input and a second input, the first input coupled to at least one of said power grid points, and the second input at least sometimes fed by said analog reference;
      an input multiplexer circuit having inputs coupled respectively to at least some of said power grid points and an output coupled to the first input of said operational amplifier;
      an analog to digital converter circuit fed by said input circuit, said analog to digital converter producing an output; and
      a multi-bit output interface fed from said analog to digital converter.

15. The integrated circuit claimed in claim 14 wherein said operational amplifier is structured to provide an output as a function of the difference of voltages at its first and second inputs.

16. The integrated circuit claimed in claim 14 further comprising a control circuit coupled to operate said input multiplexer circuit to progressively select power grid points at least one at a time.

17. The integrated circuit claimed in claim 14 wherein said input multiplexer circuit also has an input for said analog reference and has a second output, said input multiplexer circuit coupled via the two outputs to feed selected inputs pairwise to the first and second inputs of said operational amplifier.

* * * * *